US012695436B2

(12) United States Patent

Høj et al.

(10) Patent No.: US 12,695,436 B2

(45) Date of Patent: Jul. 28, 2026

(54) DENSITY-MODULATED PHONONIC MEMBRANES

(71) Applicant: Danmarks Tekniske Universitet, Kongens Lyngby (DK)

(72) Inventors: Dennis Høj, Kongens Lyngby (DK); Ulrich Busk Hoff, Kongens Lyngby (DK); Ulrik Lund Andersen, Kongens Lyngby (DK)

(73) Assignee: DANMARKS TEKNISKE UNIVERSITET, Kongens Lyngby (DK)

( * ) Notice: Subject to any disclaimer, the term of this patent is extended or adjusted under 35 U.S.C. 154(b) by 219 days.

(21) Appl. No.: 18/548,375

(22) PCT Filed: Mar. 18, 2022

(86) PCT No.: PCT/EP2022/057174

§ 371 (c)(1),
(2) Date: Aug. 30, 2023

(87) PCT Pub. No.: WO2022/195083

PCT Pub. Date: Sep. 22, 2022

(65) Prior Publication Data

US 2024/0186974 A1 Jun. 6, 2024

(30) Foreign Application Priority Data

Mar. 19, 2021 (EP) .................................... 21163818

(51) Int. Cl.
*H03H 9/02* (2006.01)
*G01H 13/00* (2006.01)

(52) U.S. Cl.
CPC ........ *H03H 9/02244* (2013.01); *G01H 13/00* (2013.01)

(58) Field of Classification Search
CPC ..... H03H 9/02244; H03H 2009/02488; H03H 9/02433; H03H 2009/02283; G01H 13/00; G01N 29/022; G01N 29/036; G01N 29/24
See application file for complete search history.

(56) References Cited

U.S. PATENT DOCUMENTS

| | | |
|---|---|---|
| 7,733,198 B1 | 6/2010 | Olsson et al. |
| 2009/0295505 A1 | 12/2009 | Mohammadi et al. |
| 2016/0211828 A1* | 7/2016 | Simmonds ........... G02B 6/1225 |

FOREIGN PATENT DOCUMENTS

| | | |
|---|---|---|
| WO | WO 2018/024713 A1 | 2/2018 |
| WO | WO 2019/204393 A1 | 10/2019 |

OTHER PUBLICATIONS

Aabdin, Zainul et al., "Transient Clustering of Reaction Intermediates During Wet Etching of Silicon Nanostructures" Nano Letters, Apr. 2017, pp. 1-13.

(Continued)

*Primary Examiner* — Christopher M Koehler
*Assistant Examiner* — Viswanathan Subramanian
(74) *Attorney, Agent, or Firm* — Knobbe Martens Olson & Bear LLP

(57) ABSTRACT

The invention relates to a mechanical oscillator device comprising an unsupported membrane with a multitude of discrete mass elements distributed to form Phononic crystal cells in the form of regions of additional mass each comprising a plurality of mass elements. The phononic crystal structure has a defect for confining a mechanical oscillation mode having a resonance frequency, f, with the mass elements have a smallest lateral dimension of less than $\frac{1}{10}$ of a wavelength of the mechanical oscillation mode. The invention is based on a distribution of tiny additional mass elements providing a periodic density contrast pattern to create the bandgap. This approach keeps the tensile stress (Continued)

uniform which ensures perfect overlap between the tensile stress distribution and mode-shape. This again reduces the damping and thus allows for very high quality factors, Q.

16 Claims, 17 Drawing Sheets

(56) References Cited

OTHER PUBLICATIONS

Anufriev, Roman et al., "Phonon and heat transport control using pillar-based phononic crystals" Science and Technology of Advanced Materials, 2018, pp. 863-870, vol. 19, No. 1.

Fedorov, S.A et al., "Generalized dissipation dilution in strained mechanical resonators" Phys. Rev. B 99, 2019.

Joannopoulos, John D. et al., "Photonic Crystals Molding the Flow of Light" Second Edition, Princeton University Press, 2008.

Li, Yang Fan et al., "Topological Design of Cellular Phononic Band Gap Crystals" Materials, 2016, pp. 1-22, vol. 9, No. 186.

Prasad, Alisha et al., "Nanohole array plasmonic biosensors: Emerging point-of-care applications" Biosensors and Bioelectronics, 2019, pp. 185-203, vol. 130.

Reetz, C. et al., "Analysis of Membrane Phononic Crystals with Wide Band Gaps and Low-Mass Defects" Physical Review Applied, 2019, 044027-1-044027-13, vol. 12.

Schmid, Silvan et al. "Fundamentals of Nanomechanical Resonators" 2016, ISBN: 9783319286914, DOI: 10.1007/978-3-319-28691-4.

Tsaturyan, Y. et al., "Ultracoherent nanomechanical resonators via soft clamping and dissipation dilution" Nature Nanotechnology, Jun. 2017.

Vasileiadis, Thomas et al., "Progress and perspectives on phononic crystals" Journal of Applied Physics, 2021, vol. 129, 160901-1-160901-25.

Xue, Longjian et al., "Hybrid Surface Patterns Mimicking the Design of the Adhesive Toe Pad of Tree Frog" ACS Nano, 2017, pp. 9711-9719, vol. 11.

European Search Report for EP 21163818 dated Aug. 18, 2021.

International Search Report for PCT/EP2022/057174 dated Jul. 5, 2022.

* cited by examiner

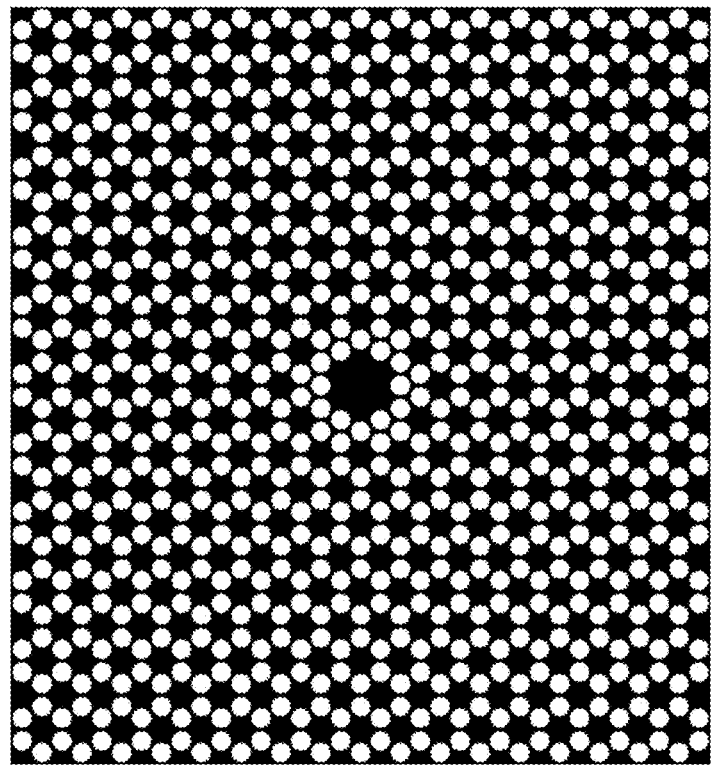
Fig. 1A
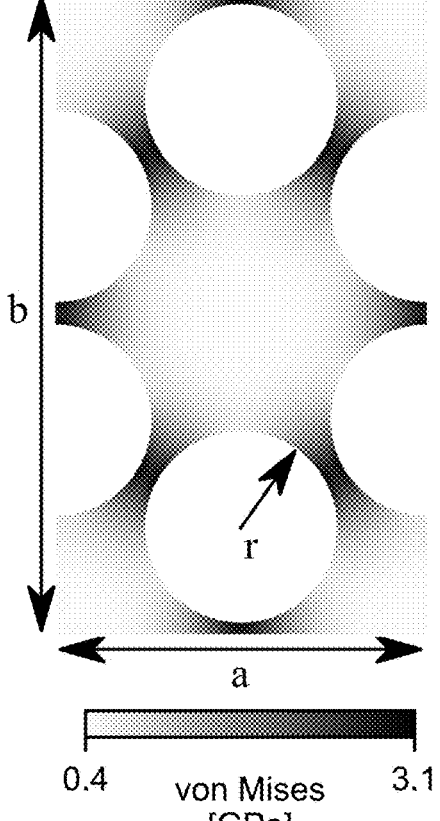
0.4     von Mises     3.1     Fig. 1B
[GPa]

Binary distribution

Rel. eff. density distribution, g(x,y)

Sine-like distribution

Rel. eff. density distribution, $g(x,y)$

100

S102 Providing a thin film on a supporting substrate

S104 Providing a multitude of discrete mass elements on a first section of the thin film S106 Shaping the supporting substrate to expose the first section of the thin film to form an unsupported membrane

DENSITY-MODULATED PHONONIC MEMBRANES

CROSS REFERENCE TO RELATED APPLICATIONS

This application is a U.S. National Phase Application of PCT International Application Number PCT/EP2022/057174, filed on Mar. 18, 2022, designating the United States of America and published in the English language, which is an International Application of and claims the benefit of priority to European Patent Application No. 21163818.4, filed on Mar. 19, 2021. The disclosures of the above-referenced applications are hereby expressly incorporated by reference in their entireties.

TECHNICAL FIELD

The invention relates to micro-mechanical oscillators with ultra-low damping rates, in particular membranes with phononic crystal structures.

BACKGROUND

High-quality micro-mechanical oscillators are vital for micro electro-mechanical systems (MEMS) sensors that are extensively used in industrial as well as consumer electronics, e.g. smart phones. The precision of such sensors can be improved with smaller damping rates of the oscillator. The damping rate of an oscillator is typically described by the quality factor Q defined as $Q=f/\Delta f$, where f is the resonance frequency of the oscillator and $\Delta f$ is the bandwidth (i.e. the bandwidth over which the power of vibration is greater than half the power at the resonant frequency). The higher Q, the smaller the loss and the damping, and the longer the oscillator vibrates. The smaller the bandwidth (i.e. higher Q), the more well-defined is the resonance which can increase the sensitivity of a sensor based thereon.

Such micro-mechanical oscillators having ultra-low damping rates also have applications for research in quantum cavity opto-mechanics, in which the interaction between resonant optical field and a mechanical mode is studied. The availability of such ultra-coherent mechanical oscillators enable both fundamental tests of quantum mechanics and applications in quantum information processing and sensing. It can be used as a sensor exhibiting unprecedented sensitivity, as a memory for quantum information and as an efficient transducer of quantum information between the microwave of optical frequency domains.

In the fields mentioned above there is an interest in micro-mechanical oscillators with high values of Q, and impressive results using membranes embedded with a phononic crystal (PnC) pattern have been reported, see e.g. WO/2018/024713. In such prior art devices aiming at maximizing Q, the phononic crystal pattern is made by cells that are holes in a thin film membrane etched in a hexagonal pattern as illustrated in FIG. 1A. As illustrated in FIG. 1B, the holes effectively create a pattern of high-stress tethers connected via small low-stress pads. This omnidirectional stress pattern creates a bandgap in all directions and can be used to confine a two-dimensional mechanical wave inside a defect in the PnC. This type of phononic crystal design will from this point on be referred to as stress phononic membranes/crystals.

On an explanatory note, the term 'crystal' in the field of phononic crystals refers to the periodic layout of scattering centers (the cells) that results in a bandgap in the vibrational spectrum of the medium. This is not to be confused with 'crystal' referring to the internal structure of a solid material, where it refers to the three-dimension arrangement of the atoms/molecules. Membranes with phononic crystals have also been used study and control thermal conductivity and thermoelectric effects of the crystalline base materials, examples include WO 2019204393A1 and US 2009295505A1.

SUMMARY

An objective of the invention is to provide mechanical resonators with higher quality factors than provided in the prior art.

It is a disadvantage of prior art stress phononic membranes that the defect-confined mode shape overlaps poorly with the high tensile stress distribution from the cells. This means that the damping dilution effect is not utilized properly. One could try and tweak the phononic pattern by making the tethers wider to induce higher stress in the pads, but this comes at the cost of a poorer bandgap due to the reduced tensile stress contrast. This in turn leads to poorer mode confinement.

The present invention provides a novel approach for designing phononic crystals. Whereas the prior art is based on holes in or massive columns on a membrane providing a periodic tensile stress contrast pattern to create the bandgap in the phononic crystals, the invention creates a bandgap by providing a periodic density contrast pattern through a periodic pattern of additional mass regions each consisting of a distribution of a large number of discrete mass elements. This approach keeps the tensile stress uniform which ensures perfect overlap between the tensile stress distribution and mode-shape.

In one implementation, this disclosure provides a mechanical oscillator device comprising a thin film on a supporting substrate, with the supporting substrate being shaped to expose an area of the thin film to form an unsupported membrane; the membrane comprising a multitude of discrete mass elements distributed to form regions of additional mass on the membrane, with each region of additional mass comprising a plurality of mass elements; wherein:

the regions of additional mass form a periodic pattern providing a phononic crystal structure on the membrane;

the phononic crystal structure exhibits a defect for confining a mechanical oscillation mode having a resonance frequency, f, and corresponding wavelength, $\lambda$; and a minimum lateral dimension, d, of the mass elements is less than $^{1}\!/_{10}$ of the wavelength of the mechanical oscillation mode.

The regions of additional mass are the PnC cells, i.e. the periodic density contrast pattern that causes the bandgap. Each of these regions are then formed by—or fragmented into—a distribution of smaller, discrete mass elements. In the present disclosure, a region of additional mass is for brevity also simply referred to as the region or the (unit) cell, especially when referring to its function as PnC cell and not to its internal structure. These regions of additional mass are laid out periodically to form the PnC and in the prior art typically provided by holes in the membrane. In the present disclosure, the discrete mass elements are for brevity also referred to as pillars although they may have different shapes. A plurality of these pillars are spaced closely to form a region of additional mass—thus a plurality of pillars are needed to form one unit cell.

In an alternative formulation, the disclosure provides a mechanical oscillator device comprising a thin-film on a supporting substrate, with the substrate being shaped to expose an area of the film to form an unsupported membrane, and a periodic pattern of regions of additional mass forming a phononic crystal structure on the membrane; wherein: the phononic crystal structure exhibits a defect for confining a mechanical oscillation mode having a resonance frequency; and each region of additional mass is formed by a distribution of a plurality of discrete, nanoscale mass elements having a smallest lateral dimension of less than $\frac{1}{10}$ of a wavelength of the mechanical oscillation mode.

In the present disclosure, that the mass elements are discrete means that mass elements consist of distinct or unconnected elements formed on or with the membrane and being separated by sections of the membrane without mass element(s).

One could consider making the regions of additional mass by continuous features such as an increase in the thickness or material composition of the membrane in the size of a cell, or by large pillars the size of a cell as is also known from other fields. This, however, introduces variations in the tensile stress in the membrane, with such variations having lateral sizes of the same order as the PnC cells (since the size of a cell is usually defined by a small number of regions) and thus the wavelength of the mechanical oscillation mode. This is disadvantageous since it can be shown that such tensile stress variations lead to distortion in the shape of the mechanical oscillation mode. It is further disadvantageous since it increases the bending stiffness of the membrane which may increase the loss and reduce the Q-factor.

Forming the regions of additional mass with many, smaller, discrete mass elements, provides the combined effect of leaving the tensile stress (more) uniform along at least one direction in the plane of the membrane and the bending stiffness almost unchanged. An additional advantageous effect of this "fragmenting" of the regions of additional mass is to dilute mode shape distortion by the crystal structure, or, in other words, to reduce the effect that the cells have on the shape of the vibrational mode. This again leads to an increased Q-factor. The mass elements may have a range of shapes and sizes and preferably a minimum or smallest lateral dimension of the mass elements is less than $\frac{1}{10}$ of the wavelength of the mechanical oscillation mode. Here, 'lateral' meaning in the plane of the membrane and 'minimum or smallest lateral dimension' meaning its size in the lateral direction where the mass element is the smallest i.e. the dimension of the mass element is at a minimum in that lateral direction. For example, a cylindrical mass element will have the same minimum size in all lateral directions whereas a polygon or an oblong or irregular shape will have different sizes in different lateral directions. It logically follows that a minimum lateral dimension can be defined for any shape of a mass element. In a preferred embodiment, the mass elements are pillars, but they may have elongated shapes standing up or lying down—this will be elaborated on later.

The resonance frequency and wavelength of the mechanical oscillation mode is determined by the design parameters of the mechanical oscillator device. It is usually determined by modeling and/or simulation prior to fabrication and can be measured in the fabricated device. The determining parameter for the wavelength of the oscillation mode is the periodicity of the phononic crystal structure. The exact relation between the wavelength and the periodicity depends on the type of membrane and the PnC pattern. The determining parameters for the resonance frequency are the periodicity of the phononic crystal structure, the size of the defect, and the tensile stress of the membrane. These determining parameters generally determine the 'order of magnitude' of the resonance frequency. Further parameters influence the precise value of the resonance frequency such as the density distribution of the regions of additional mass, the materials used, and nonlinear mechanical effects arising from large vibrational amplitudes.

The pressure, temperature, air density of the environment in which the oscillator operates, incident electromagnetic waves, and external acceleration, will also have an effect on the resonance frequency. The membrane's susceptibility to influencing parameters, as listed above, provides for a versatile sensing capability through perturbations of its natural resonance frequency (design frequency). The sensitivity df of a membrane with natural resonance frequency f, when employed as a sensor, is determined by its Q-factor as $df=f/Q$.

A 'defect' or a 'defect mode' in a phononic crystal structure is a well-known concept in the field of phononic crystal oscillators, see e.g. J. Appl. Phys. 129, 160901 (2021); https://doi.orq/10.1063/5.0042337, and may be provided by the omission or addition of a cell in the periodic structure or a break in the periodicity achieved by modification of the position, shape, and/or size of one or more unit cells. For the present disclosure, a defect is a modification of the phononic crystal structure that locally disturbs the periodic pattern and enables a mode inside the PnC bandgap to exist. If a PnC has no defect it does not support a localized phononic/acoustic mode. If there is no localized phononic/acoustic mode, the device is not an oscillator with a well-defined resonance frequency and wavelength.

The membrane may be 'two-dimensional' (2D) and supported by the supporting substrate along the entirety of its circumference, or it may be a 'one-dimensional' string membrane which is supported by the supporting substrate only at two opposite ends. As will be understood by the skilled person, a string membrane is not strictly one-dimensional in that it has finite width typically one or more orders of magnitude larger than its thickness. Throughout the disclosure, most examples relate to 2D membranes, but the disclosed design principles are equally applicable to string membranes.

The disclosure also provides a sensor comprising the mechanical oscillator device, comprising a setup, such as an electrical or optical setup, for determining an oscillation characteristic, such as frequency, amplitude, phase, ring down period etc., of the oscillating membrane. Such a sensor may be used for many different applications, such as for example sensing gas pressure, gas density, molecular and atomic absorption on the membrane, and force on the mechanical oscillator device.

The disclosure further provides a method for providing a mechanical oscillator device, comprising:

providing a thin film on a supporting substrate;

providing a multitude of discrete mass elements on a first section of the thin film, the mass elements being distributed to form regions of additional mass on the first section of the thin film, with each region of additional mass comprising a plurality of mass elements; wherein the regions of additional mass form a periodic pattern providing a phononic crystal structure on the first section of the thin film; and shaping the supporting substrate to expose the first section of the thin film to form an unsupported membrane;

wherein the phononic crystal structure exhibits a defect for confining a mechanical oscillation mode of the membrane having a resonance frequency, f, and corresponding wavelength, λ, and wherein a minimum lateral dimension, d, of the mass elements is less than 1/10 of the wavelength of the mechanical oscillation mode.

The above embodiments are advantageous in that they provide the use of regions of additional mass instead of holes as cells of the PnC.

Membranes with PnC's formed by pillars have been reported in other fields such as by Anufriev et al. (2018) "Phonon and heat transport control using pillar-based phononic crystals", Science and Technology of Advanced Materials, 19:1, 863-870 (DOI: 10.1080/14686996.2018.1542524). Here, nanosized phononic crystals are used to control heat conduction and improve the thermoelectric efficiency of silicon—the membrane is not used as an oscillator nor does the PnC exhibit a defect.

In the following, preferred and/or optional features, elements, and examples will be described in more detail. Explanations of underlying mechanisms of the invention as realized by the inventors are presented for explanatory purposes and should not be used in ex post facto analysis for deducing the invention.

BRIEF DESCRIPTION OF THE FIGURES

FIGS. 1A and B are illustrations of stress phononic crystals with 1A showing the phononic crystal structure with cells provided by etched holes with a missing-hole defect in the middle, and 1B illustrating the pattern of high-stress tethers connected via small low-stress pads.

DETAILED DESCRIPTION

Figure 2:
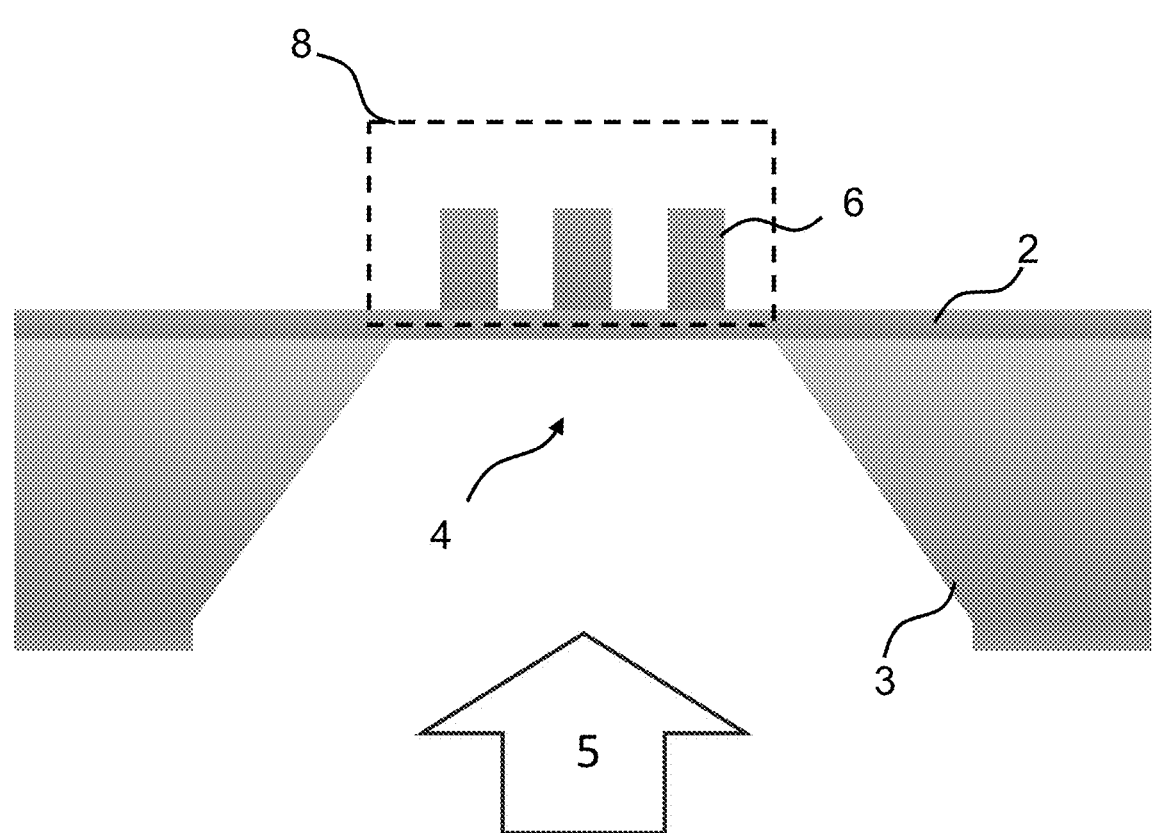
FIG. 2 illustrates a side-view of a mechanical oscillator device according to the disclosure.

A membrane oscillator experiences different damping mechanisms which may affect the resonator's performance. These can largely be divided into 1. Gas damping: An external force of colliding gas molecules impeding the movement of the resonator.
2. Intrinsic loss: Internal friction forces resulting in internal damping, including boundary bending losses at the boundary where the membrane attaches to the supporting substrate and distributed bending losses in regions far from the boundary.
3. Phonon tunneling loss: Phonons of the resonator which couple and are lost to the surrounding substrate. This loss mechanism is also known under a broad range of other names: Radiation losses, clamping losses, anchoring losses and external losses.

The different damping mechanisms have individual quality factor contributions where W is the resonator mode energy, ΔWi the lost energy per cycle for the damping contribution i. The $$Q_i = 2\pi \frac{W}{\Delta W_i}$$

-continued $$Q^{-1} = \sum_i Q_i^{-1}$$

total quality factor of an oscillator can then be computed by where it is evident the lowest quality factor contribution will dominate the quality factor of the oscillator.

In general, a good textbook reference for the field of membrane oscillators is Silvan Schmid, Luis Guillermo Villanueva, and Michael Lee Roukes. *Fundamentals of nanomechanical resonators.* 2016, pp. 1-175. ISBN: 9783319286914. DOI: 10.1007/978-3-319-28691-4.

The use of phononic crystal structures on the membranes to reduce phonon tunneling losses are known in the prior art. A phononic crystal can be created by introducing periodic contrast in the phase speed of the out-of-plane vibration in the membrane (i.e. periodic variation in the phase speed as a function of position in the membrane).

The phase speed of a vibration can for the high tensile stress regime be estimated as $$c_\sigma = \sqrt{\frac{\sigma}{\rho}}.$$

Where $\sigma$ and $\rho$ are tensile stress and material density, respectively. a can be modulated simply by modulating the width of a string or by creating a two-dimensional pattern of pad-tether structures by holes in a membrane, see also FIG. 1A. This creates domains of high and low tensile stress as illustrated in FIG. 1B and is the standard method utilized by prior art stress phononic crystals such as those reported in WO/2018/024713. Due to the bandgap frequencies in a phononic crystal, a wave with a frequency in the bandgap will couple evanescently into the crystal and decay by some amount per cell. When placing a defect inside such a crystal the vibrations of the defect (with a frequency in the bandgap) can be completely isolated when enough cells are used. The defect can take many forms and be provided in many ways. Its main characteristic is that it locally disturbs the periodic pattern which enables a mode inside the bandgap to exist. The isolation of the vibrational mode of the defect achieves two things. Firstly, the isolation ensures the phonons confined to the defect are unable to couple to the external environment. This practically eliminates phonon tunneling losses. Secondly, the evanescent coupling to the phononic crystals is soft and does not induce the high boundary bending losses which other resonators are prone to. With sufficiently high number of isolating phononic cells the defect-confined mode cannot "feel" the hard substrate boundary. In practice, boundary bending losses vanish and only distributed bending losses remain. This effect is known as soft-clamping.

FIG. 2 is a side-view of a micromechanical oscillator device 1 according to an embodiment of the invention, with a thin film 2 on a supporting substrate 3. The supporting substrate is shaped to expose an area of the thin film forming an unsupported membrane 4. A periodic pattern of regions of additional mass 6 provides cells forming a phononic crystal structure 8 on the membrane 4. Each region of additional mass 6 is formed by a distribution of a plurality of discrete, mass elements 10 (not visible in FIG. 2).

The present invention utilizes the realization that the periodic contrast in the phase speed can also be achieved by periodically modulating the material density p. As mentioned previously, periodically modulating the material density with 'bulk' features such as cell-sized modulations in the membrane thickness or material compositing or large pillars to make the PnC involves disadvantages of making the tensile stress non-uniform and increasing the bending stiffness of the membrane. The present invention thus utilizes the further realization illustrated in FIG. 3 that the cells 6 modulating the material density to provide the PnC 8 may instead be formed by a distribution of a plurality of smaller, discrete mass elements 10. Here, the mass elements 10 have lateral dimension, d, and periodicity or mean distance, a, and the cells 6 of the PnC 8 have lateral dimension, $d_{Ph}$, and period, $a_{Ph}$.

The mass elements are elements that add mass to the membrane and that are so small that their effect is uniform as seen by the vibrational modes. Between the discrete mass elements, the 'original' membrane thickness and material composition is conserved.

Figure 4A:
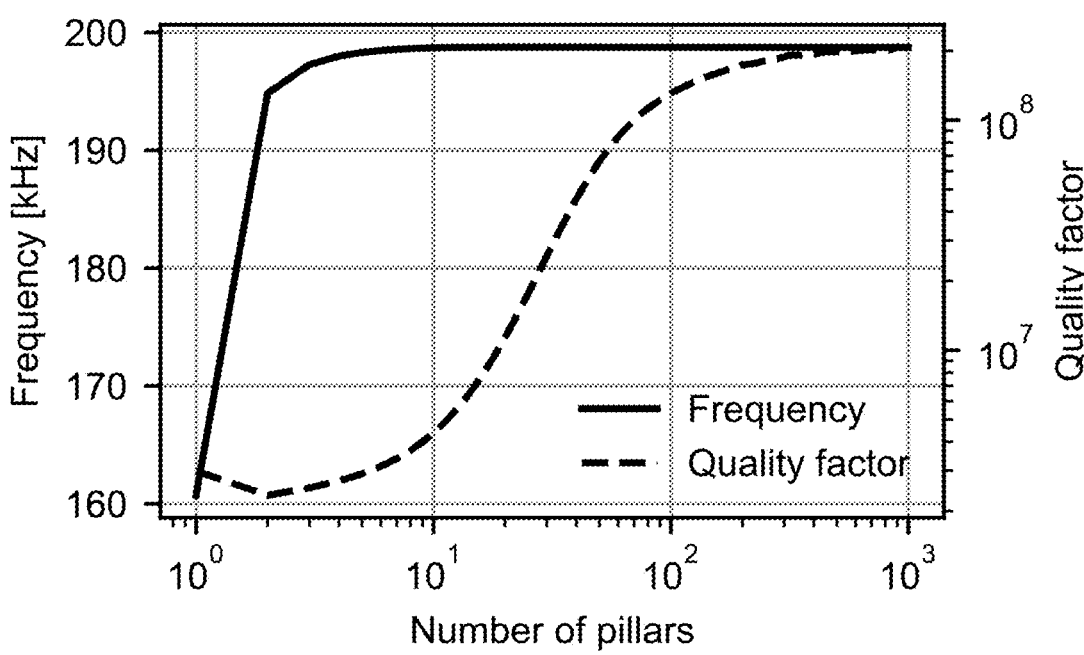
FIGS. 4A-B are numerical simulation results illustrating the effect of increasing the mass element distribution density and the local stress formed at the base of each mass element.
Figure 4B:
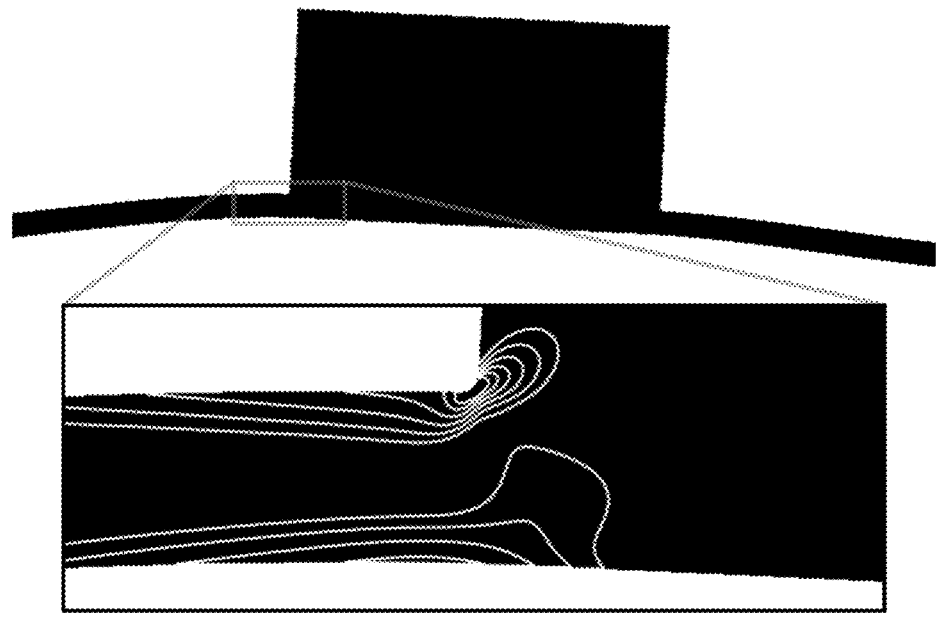

The introduction of the mass elements on the membrane does introduce extra damping in the form of an evanescent wave at the base of each mass element similar to boundary bending losses. This is highlighted on FIG. 4B showing the results of a simulation of the bending losses introduced by a mass element on a one-dimensional string. The current understanding is that a fine distribution of mass elements dilutes the resulting added bending losses into many and overall negligible contributions compared to a coarse distribution. This is illustrated on FIG. 4A showing a numerical evaluation of eigen-frequency and quality factor of a simply supported, one-dimensional, silicon nitride string vs. number of pillars uniformly spread along the string. The dashed lines are the solutions for a string without mass elements. It can be seen that the mass element-induced damping contribution can be reduced by using an increasingly finer distribution of mass elements, where a resolution of $d=a/2 \leq 1$ μm may be sufficient to effectively negate it. It is noted that the distribution requirement is dependent on the wavelength and hence the frequency of the device. Numerical evaluations show that doubling the frequency changes the required mass element distribution mean distance (or periodicity if periodic distribution) to half the distance to negate the added damping. Therefore, to design ultra-coherent resonators with very high Q factors, one of the main challenges will be to fabricate mass elements with very fine resolution. Considering FIG. 4A, it is therefore also to be understood that, when referring to a 'uniform tensile stress' in the present disclosure, there may be non-uniform effects but on a scale so small that their influence is negligible — like in a fine pixelated image.

In a preferred embodiment, a majority of the mass elements are distributed periodically within regions of additional mass, such as in a hexagonal pattern, as this keeps their small tensile stress contributions as uniform as possible. Also, the mass elements preferably have at least some rotational symmetries around an axis perpendicular to the plane of the membrane as this allows the mass elements to be placed in a closest packing with a high density.

Figure 5:
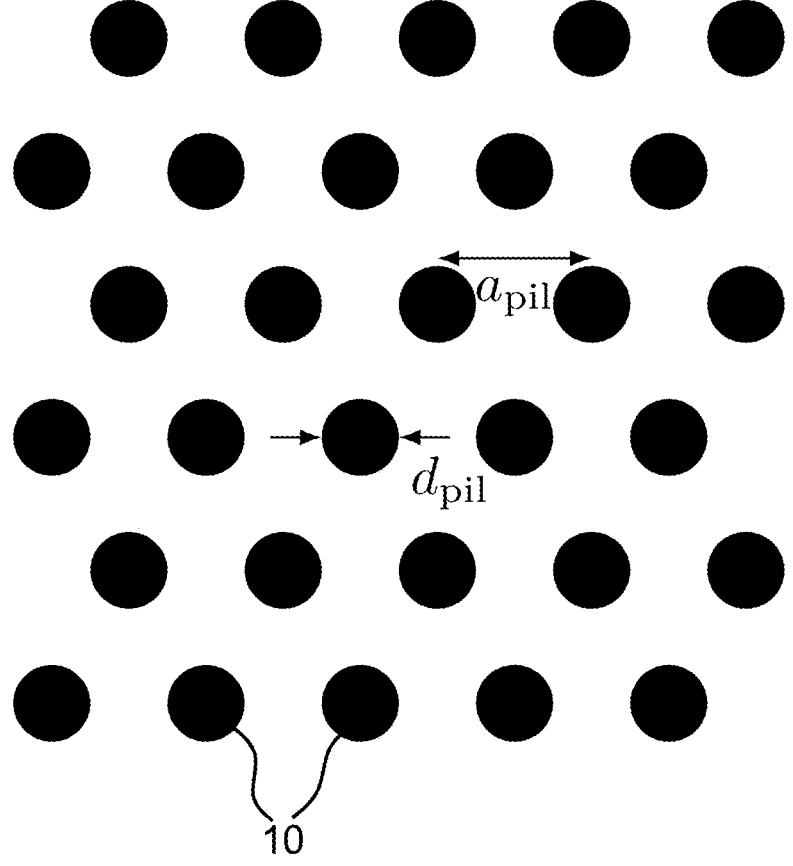
FIG. 5 illustrates an example according to the disclosure where the mass element distribution is a hexagonal pattern consisting of circular pillars.

In one example, Shown in FIG. 5, the mass element distribution is a hexagonal pattern consisting of circular pillars. This pattern and the circular shape is among the simplest structures to fabricate. Further, this example is the simplest to approach calculation-wise and will be used in many of the examples and figures in the following without the scope of the invention being limited to just this type of mass elements and distribution.

In another example, the mass elements are elongated in a direction perpendicular to the plane of the membrane, like pillars but not necessarily circular and of constant lateral dimensions. Examples of such mass elements may be pyramids, cones, mushrooms, etc. The higher the mass element, the more mass it adds with the same footprint. Since the mass elements themselves have eigenfrequencies, there is a risk that these eigenfrequencies may overlap and thus interfere with the vibration modes of the membrane, especially if the mass elements become too high. This may be considered when designing the device but is relatively easy to avoid.

In another example, the mass elements are elongated in a direction parallel to the plane of the membrane, like lines or walls, preferably designed to extend in a direction perpendicular to the direction of propagation of the mode of vibration. An elongated mass element can generally be assigned a width as the dimension transverse to the direction of elongation and a length as the dimension parallel to the direction of elongation. Here, a smallest or minimum lateral dimension would then be the width. When using such laterally elongated mass elements, the uniformity of the tensile stress will be along at least one direction in the plane of the membrane.

As described previously, the wavelength, $\lambda$, of the mechanical oscillation mode is an inherent property of the device and is predominantly determined by the periodicity of the phononic crystal structure, $a_{Ph}$. The exact relation between $\lambda$ and $a_{ph}$ depends on the type of membrane and the PnC pattern. The wavelength can be determined by calculation, simulation, or measurement. As discussed later with reference to FIG. 16, preliminary results indicate that the smaller the lateral dimension of the mass elements and the closer they stand (the 'pillar periodicity', which logically needs to be larger than the lateral dimension of the pillars), the higher the Q-factor may be achieved.

In an exemplary embodiment, the smallest lateral dimension of the mass elements is between 50-500 nm, such as preferably 100-200 nm.

The main function of the mass elements is to add mass to the membrane. The mass elements may therefore be formed in any solid material or material composition such as metals, polymers, semiconductors etc., albeit preferably any material compatible with microfabrication techniques. For example, mass elements are preferably formed by an amorphous material as these are easier to work with in fabrication, but crystalline will work just as well when it comes to providing a density modulation. Different parts of a single mass element or of a distribution of mass elements may also be formed in different materials. Preferred materials for the mass elements are silicon nitride, silicon carbide, diamond, calcium fluoride, polymers, gold, titanium, chromium, nickel, and as well as other metals. The mass elements are preferably formed by the same material as the thin film, please refer to the detailed description of the thin film later herein.

The mass element distribution may be periodic, sectionwise periodic, or a-periodical. In any case, it is possible to determine or estimate a mean distance, a, between the mass elements. The smaller the mean distance, the finer the distribution. For some periodic distributions, such as for a hexagonal distribution, the mean distance is identical to the period. As discussed above in relation to FIG. 4A, the finer the distribution the more the effect of the damping added by the pillars is reduced. In a preferred embodiment, the mass elements have a mean distance, a, less than 5 micrometers, such as less than 2 micrometers. The optimal distance between the mass elements depends, among other things, on the resonance frequency of the confined mode. As a rule-of-thumb, a mean distance, a, of 400 nm works well for a resonance frequency of 1 MHz, and these are inversely proportional so that if the frequency is doubled, the distance should be halved.

The relation between the mean distance and the lateral dimension of the mass elements is a preferred design parameter for the mass element distribution. In general, for a coarse distribution a good relation is d≈a/2 whereas for a fine distribution a good relation is closer to d≈0,3 a. In a preferred embodiment, the relation between the mean distance and the lateral dimension of the mass elements in the distribution is 0,2a<d<0,8a.

It should be noted that the use of mass elements to form the phononic crystal on the membrane in the devices of the disclosure does in no way exclude the use of holes in the membrane in addition to the mass elements. In exemplary implementations of the device, the use of holes, in addition to the mass elements forming the regions of additional mass, may be used to increase the density contrast and/or increase the tensile stress of the membrane.

Where the mass element distribution is a closest packing of very small elements, it may be thought of as a modulation of the density of the membrane, in the following introduced as the concept of the 'effective material density', $\rho_{eff}$. The effective material density is the amount of mass from the membrane and the discrete mass elements within a given unit area of the membrane. It is noted that the effective material density is a constructed parameter used in the theoretical approach to optimize the design, and not a physical parameter of the oscillator structure.

Since the mass elements are discrete, the effective material density for a unit area, A, of the membrane with coordinates i, j ∈ ℵ can be defined as:

$$\rho_{eff}(i, j) = \rho + \sum_{n} \frac{\rho_n V_n}{hA}$$

Where it is assumed that the thin film forming the basic membrane has uniform density p and thickness h, and where the n-summation is over mass elements with density $\rho_n$ and volume $V_n$ located within the unit area (i, j). As can be seen, the effective material density treats the mass of the discrete mass elements as lying within the thickness of the membrane.

In an embodiment where the discrete mass elements are circular pillars of height $h_{pill}$ arranged in a hexagonal pattern as illustrated in FIG. 5, the effective material density is of a unit cell is given by $$\rho_{eff} = \rho + \rho_{pil} \frac{\pi\sqrt{3}}{6} \frac{h_{pil}}{h} \frac{d_{pil}^2}{a_{pil}^2}$$

The above is derived considering the mass contribution from a single pillar and then comparing to the mass contribution from the membrane in a single hexagonal cell.

Having defined the effective material density, the design of phononic crystals can be approached theoretically using the effective material density as a proxy for regions of additional mass formed by distributions of discrete mass elements. An example of such a theoretical approach is described in more detail in the section "Appendix A" at the end of the disclosure. Here we will take the derived design parameters and describe two preferred designs.

The design provides an effective material density model $\rho_{eff}$ as a function of position on the membrane) giving a layout of added mass for the desired density modulated PnC. This model (having reference numeral 7 in the figures) is what the mass element distribution is then designed to approximate.

The following design parameters are used:

The maximum relative effective material density, $g_{max}$, being the densest distribution of the mass elements, typically at the center of a region of additional mass (remember the distribution density, or packing of the mass elements, is modulated to form the regions of additional mass).

$g_{cmax}$ maximum relative effective material density for cells adjacent to a defect in the PnC. By adjusting their effective material density to $g_{cmax}$, the resonance frequency of the mode confined at the defect can be adjusted to better match the PnC bandgap.

The relative normalized relative size of the cells in the effective material distribution model, $\alpha_w$, if a $\alpha_w=1$, the cells will exactly touch each other.

Figure 3:
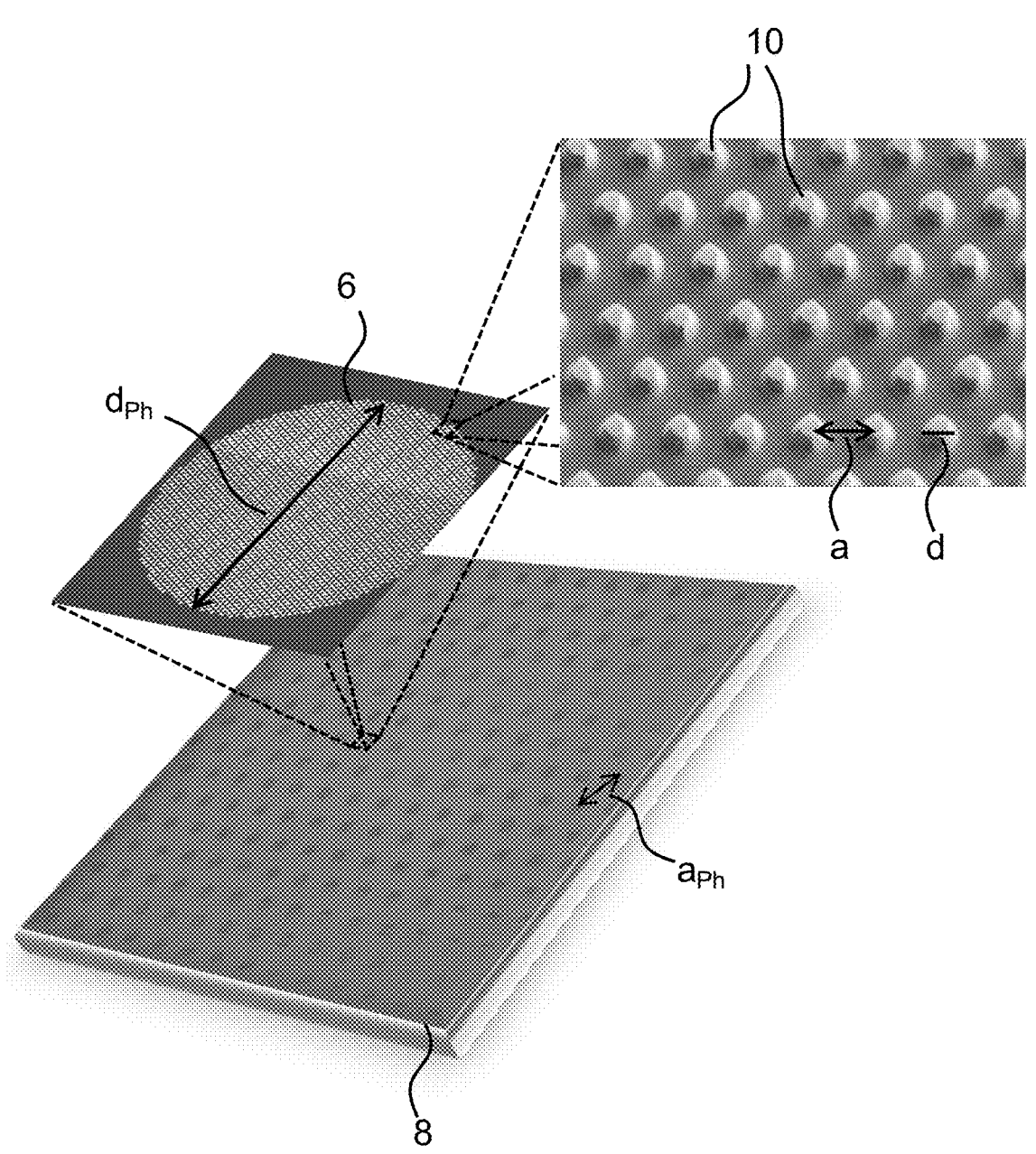
FIG. 3 Illustrates the distribution of PnC cells on a membrane according to the disclosure, the cell being a region of added mass formed by a distribution of mass elements, and a close-up of individual mass elements.

The phononic crystal periodicity, $a_{ph}$, being the period of the PnC and thus the distance between the cells in the effective material distribution model, see also FIG. 3.

Figure 6A:
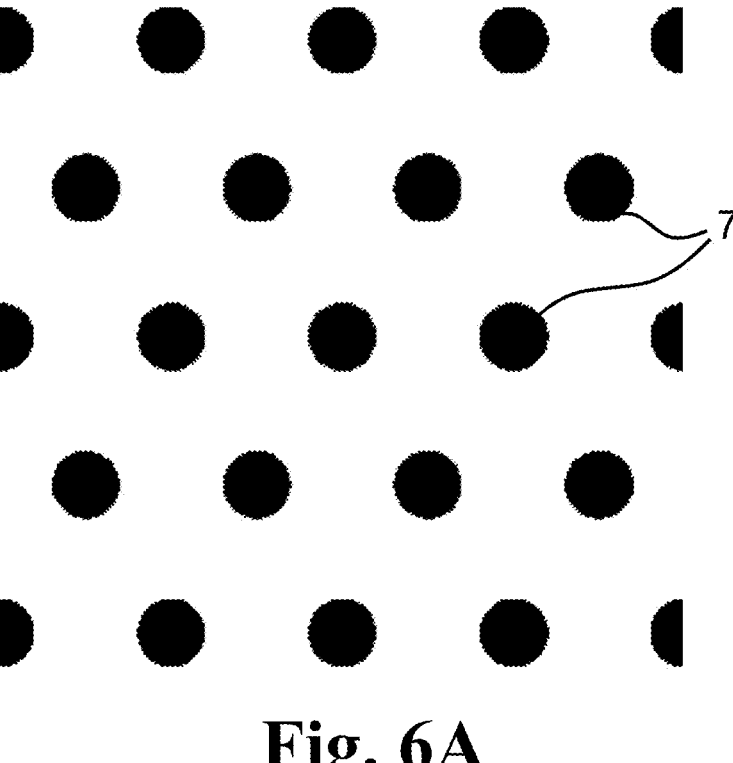
FIGS. 6A-B illustrate a binary effective material density model according to the disclosure, close up and in overview.
Figure 6B:
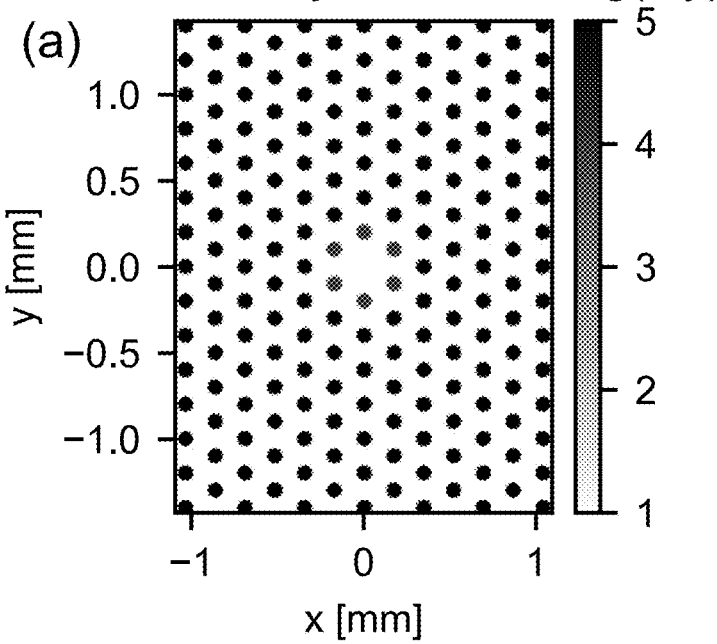
Figure 7A:
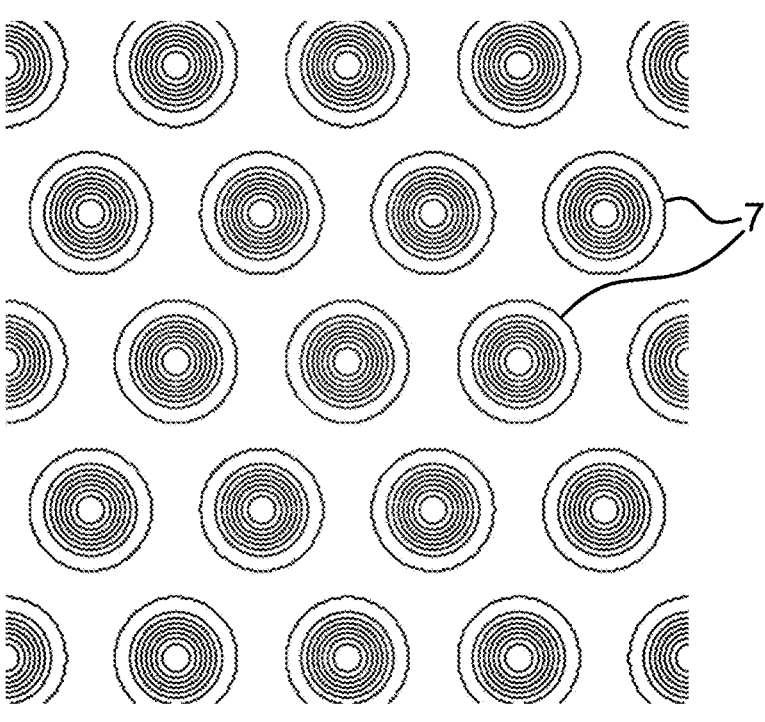
FIGS. 7A-B illustrate a sine-like effective material density model according to the disclosure, close up and in overview.
Figure 7B:
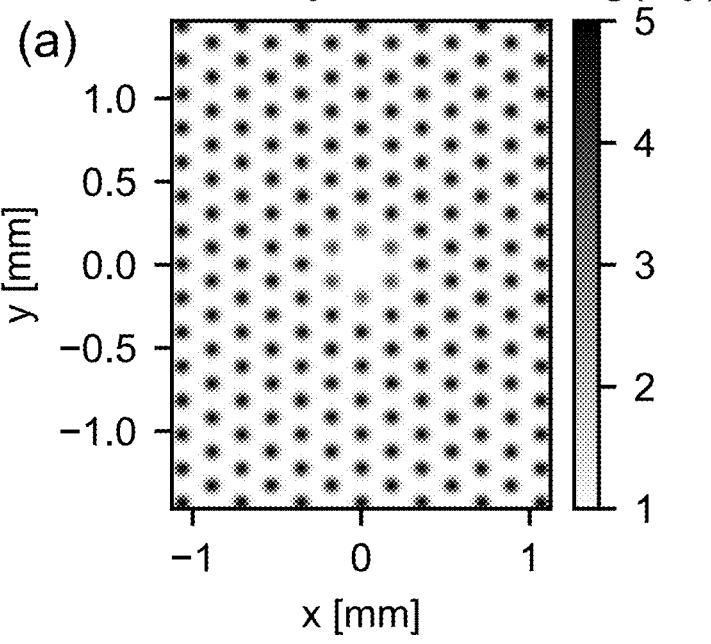

Two effective material density models illustrated in FIGS. 6 and 7 are discussed in Appendix A:

DP1 (FIGS. 6A and B): Binary density model with $\alpha_w=0.4$, $a_{ph}=198.8$ µm, $g_{max}=5$ and $g_{cmax}=3.9$.

DP2 (FIGS. 7A and B): Sine-like density model with a $\alpha_w=0.7$, $a_{ph}=204.3$ µm, $g_{max}=5$ and $g_{cmax}=3.6$.

FIGS. 6A and 7A shows the effective material density model 7 as black dots in 6A (binary distribution, $\rho_{eff}$ has constant value) and contour lines in 7A ($\rho_{eff}$ is a sine-like curve).

An advantageous feature of the invention is that any density model can be used and approximated by a sufficiently fine distribution of mass elements. This is not the case for stress phononic membranes where the stability and durability of the membrane become an issue when too many holes are made.

Figure 8:
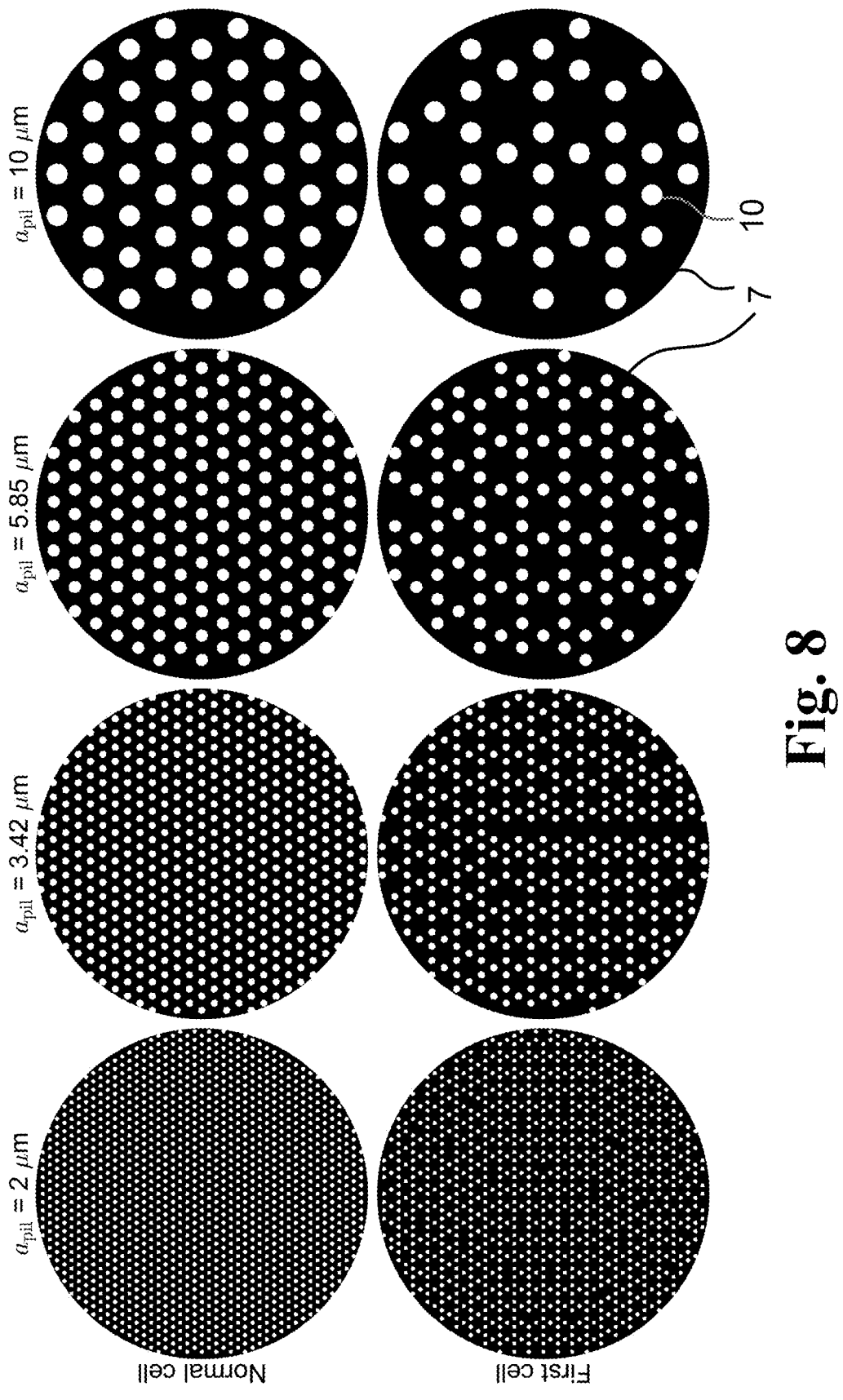
FIG. 8 illustrates binary effective material density models according to the disclosure, with their approximating mass element distributions for different mass distribution densities.

The following discussion is based on the example where all mass elements are circular pillars fabricated with the same diameter, height, and resolution on a hexagonal grid. The pillar diameter is set to half the periodicity. With these parameters fixed the only way to modulate the effective material density is by omitting pillars at certain hexagonal coordinates depending on the desired density. This discretization scheme is only approximate. Of course, finer pillar mesh resolutions will result in a better approximation of the effective material density model being converted. The simplest distribution to convert is the binary distribution which is shown for design DP1 on FIG. 8. In FIG. 8, the black circles show the effective material density model 7 of a cell of the PnC, and the small white circles show the pillar 10 layout approximating the effective material density model for different pillar periodicities $a_{pill}$. Note the bottom row has a relatively lower effective material density defined by $g_{cmax}$ resulting in that some pillars are being skipped on the hexagonal pattern. These are the 'first cells' adjacent to the defect with reduced effective material density to adjust the resonance frequency to the bandgap frequency. The corresponding layout for the more complicated sine-like distribution is shown on FIG. 9 for DP2, where the effective material density model 7 is shown as contour lines and the pillars 10 as black dots. The continuous density model is approximated by a high density of pillars in the center which gradually become less dense away from the center. Here it is clear the finer mesh resolution does a significantly better job at replicating the sine-like distribution compared to the rough resolution of $a_{pil}=10$ µm.

Figure 9:
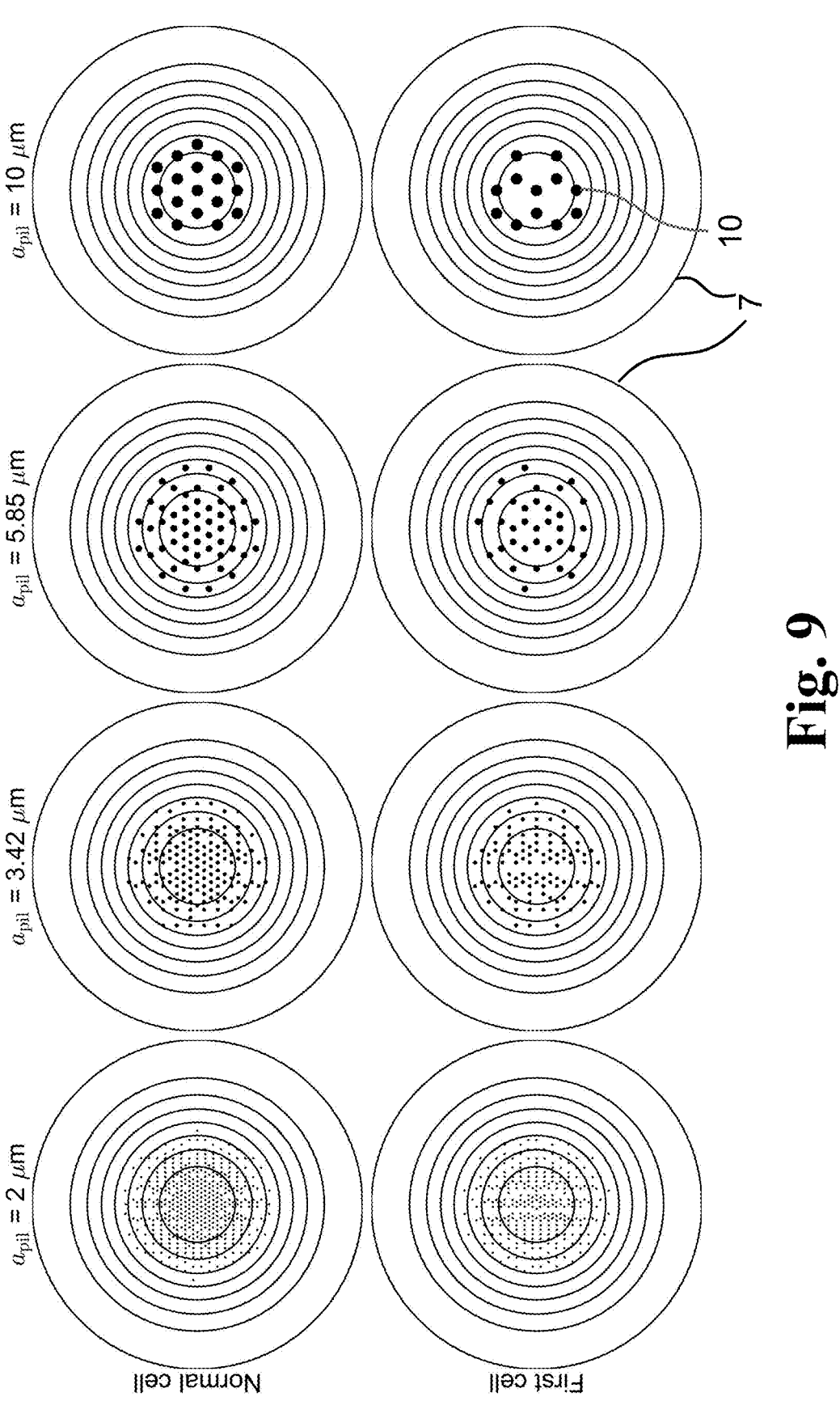
FIG. 9 illustrates sine-like effective material density models according to the disclosure, with their approximating mass element distributions for different mass distribution densities.

FIGS. 8 and 9 clearly illustrates the relation between the different structural features of the invention. The regions of additional mass 6 are the cells of the PnC, i.e. the domains on the membrane with high phase-velocity that results in the bandgap structure. As can be seen in FIGS. 8 and 9, these regions of additional mass are formed by a distribution of smaller mass elements 10—where these distributions are adjusted to approximate the effective material density model 7. How well the mass element distribution approximates the effective material density model 7 depends on the resolution of the mass element distribution is, i.e. the sized and mean distance a of the mass elements.

In a preferred embodiment, a majority of the regions of additional mass 6 are formed by an at least substantially uniform distribution of at least substantially identical mass elements 10. Such distributions form binary effective material density models and the resulting PnC cells are embodied by the examples in FIG. 8.

Figure 16:
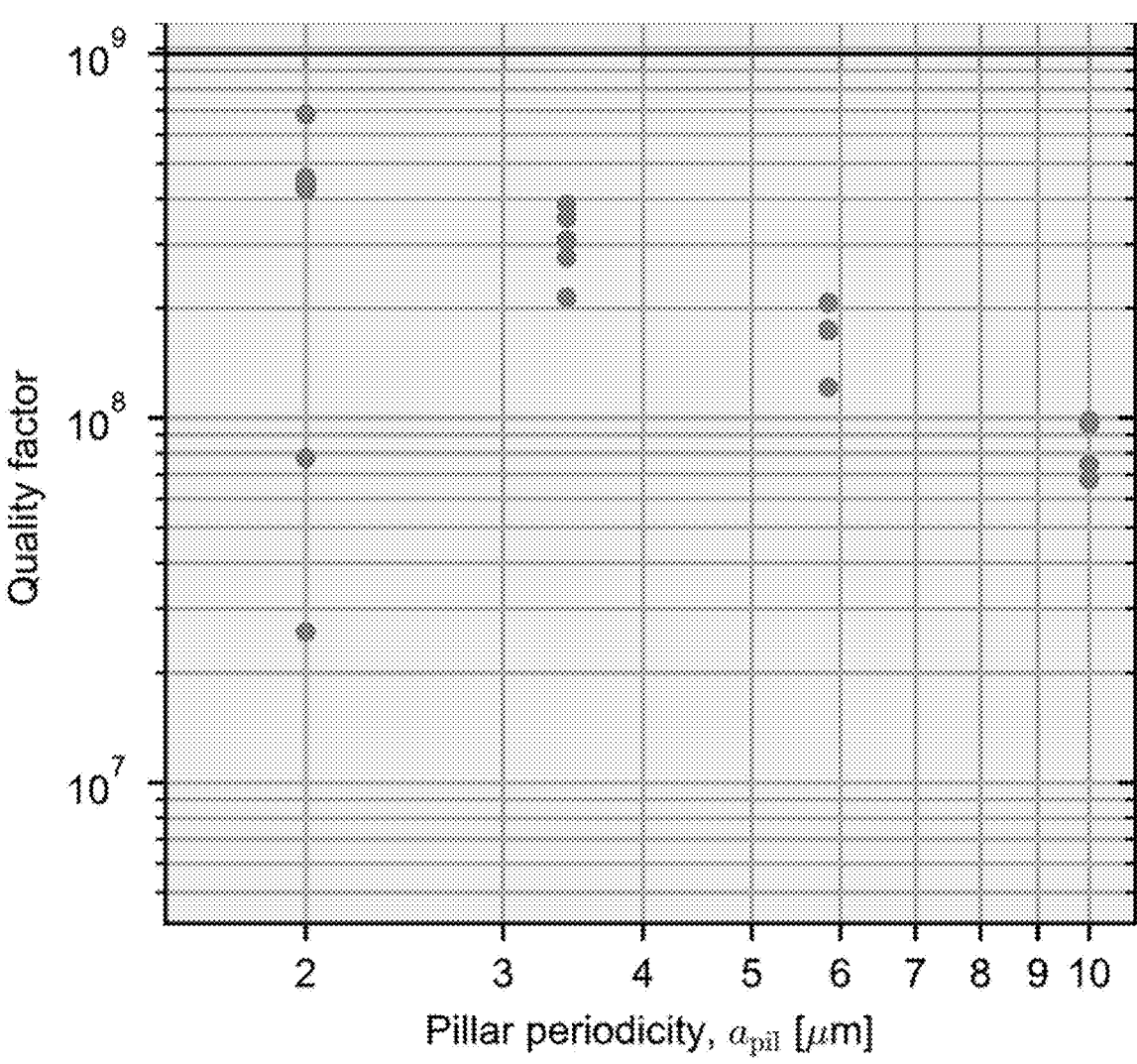
FIG. 16 shows results from a study according to the disclosure to illustrate the effect of the periodicity and size of the mass elements (pillars) on the intrinsic quality factor.
Figure 17:
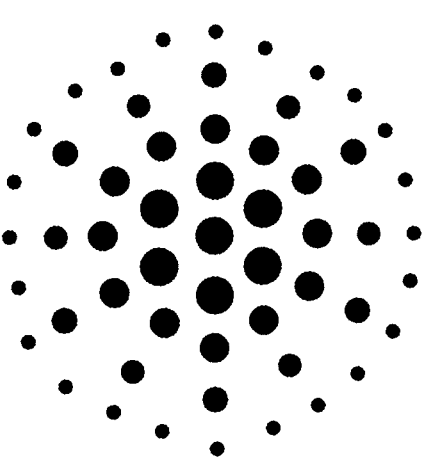
FIG. 17 illustrates a material density model according to the disclosure, with varying mass element dimensions.

Preliminary results indicate that coherent resonators with very high Q factors can be achieved by using very small pillars with high periodicity (small mean distance) to form the unit cells. FIG. 16 shows a plot of Q-factor as a function of pillar periodicity (or mean distance, $a_{pil}$) for a batch of oscillators characterized using a mechanical ringdown experimental setup. For this batch, the pillars are cylindrical with a diameter (minimum lateral dimension), $d=0,5$ $a_{pil}$ and the resonance frequency is 1,1 MHz. The plot indicates a clear trend towards smaller pillars and pillar periodicities leading to higher Q-factors. For this type of membrane, the wavelength of the mechanical oscillation mode is very close to twice the periodicity of the crystal pattern (otherwise it will be outside the bandgap). For the 1.1 MHz membranes of FIG. 16, the periodicity of the PnC is $a_{ph}=253$ µm and the wavelength is therefore appr. 506 µm.

For the 1.1 MHz membranes of FIGS. 16, $d=0,5$ $a_{pil \ and} \ \lambda \approx 506$ µm. Thus, for the rightmost oscillators with $a_{pil}=10$ µm, $d \approx \frac{1}{100} \lambda$; for the leftmost oscillators with $a_{pil}=2$ µm, $d \approx \frac{1}{500} \lambda$. In an exemplary mechanical oscillator device according to this disclosure, the minimum lateral dimension, d, of the mass elements is preferably less than $\frac{1}{10}$, such as less than $\frac{1}{20}$ or less than $\frac{1}{100}$ or less than $\frac{1}{150}$ or less than $\frac{1}{200}$ or less than $\frac{1}{300}$ or less than $\frac{1}{500}$ of the wavelength of the mechanical oscillation mode. Also, the pillar periodicity and pillar size are preferably within a range: a, and $0,2$ $a<d<0,8$ a.

In another preferred embodiment, a majority of the regions of additional mass are formed by at least substantially identical mass elements whose distribution have a density that decreases towards a boundary of the regions of additional mass. Such distributions form smoother effective material density models and the resulting PnC cells are embodied by the examples in FIG. 9. In an alternative embodiment, a majority of the regions of additional mass are formed by an at least substantially uniform distribution of mass elements whose dimensions decreases towards a boundary of the regions of additional mass. Thus, instead of 'thinning out' in the distribution to approximate the effective material density model, the mass elements are gradually made smaller. Such a distribution is embodied by the example in FIG. 16. While this provides the advantage of maintaining the resolution in the mass element distribution, it is typically more difficult to fabricate.

Although usually depicted as a missing cell, a defect is principally any disturbance in the PnC. Hence, the defect may be introduced by leaving out a cell, by changing a cell such as by adjusting (up or down) the distribution of mass elements or the dimensions of the mass elements, or by adding something that lies outside the normal cell positions. In order to obtain maximum mode confinement at the defect, the resonance frequency is preferably shifted to the center of the bandgap. This may be achieved by manipulating the cells right next to the defect. By lowering their effective material density to $g_{cmax}$, the effective mass of the defect confined mode is reduced which results in a higher resonance frequency. Alternatively or additionally, the defect itself may be designed to ensure a desired overlap between the resonance frequency and the bandgap. Thus, in a preferred embodiment, the defect and/or the regions of additional mass adjacent to the defect are configured for the resonance frequency of the mechanical oscillation mode to fall within a frequency range of a bandgap of the phononic crystal structure. The option of adjusting the cells adjacent to the defect is embodied by the lower rows in FIGS. 8 and 9. If there is only one defect, it is preferred that it is located in a central part of the membrane. However, the phononic crystal structure of a mechanical oscillator device may exhibit two or more defects on the same membrane.

Referring to FIG. 2, the membrane 4 is the unsupported part of the thin film 2 otherwise supported by the supporting structure 3. The thin film 3 may or may not extend beyond the parts immediately surrounding the unsupported part (the membrane), that is, the thin film 2 may only be formed locally on the substrate 3, it need not cover the entire substrate. In the present disclosure, a thin film is a layer of material ranging from few nanometers up to one micrometer in thickness. For mechanical oscillator devices requiring very high Q, the thickness of the thin film and thus the membrane is preferably smaller than 100 nm, such as preferably smaller than 30 nm. A thinner membrane may be advantageous since it reduces the internal damping losses. For applications where a high Q is one of several performance parameters, it may be preferable to have thicker membranes, such as up to 1 micrometer.

The lateral dimensions of the membrane' or equivalently of the unsupported part of the thin film or the shaping of the supporting structure—is selected in view of the desired resonance frequency and how many cells one wants to include to achieve a certain level of mode isolation.

It is an important advantage of the present invention that the tensile stress is uniform or at least substantially uniform due to the PnC cells being provided by fine distributions of smaller discrete mass elements. Hence, it is preferred that there is a uniform tensile stress across the membrane, and that this uniform stress is a result of all additional mass on the membrane being provided by distributions of discrete mass elements. It may, however, still be of interest to use strain engineering to achieve an increased uniform tensile stress over the membrane could improve the Q*f product by increasing both the quality factor Q and frequency f.

The preferred material for the thin film and thus for the membrane is silicon nitride. The presence of defects in amorphous materials, and especially the presence of surface impurities, is an ultimate limiting factor when reducing the losses. It may therefore be worthwhile to look for other membrane materials which do not observe the same degree of surface impurities. Silicon carbide has demonstrated intrinsic bulk quality factors above $10^5$ in cantilevers which is roughly an order of magnitude higher than for silicon nitride, although demonstrating this in membrane oscillators have not yet resulted in high performance compared to similar silicon nitride based membrane oscillators. Obtaining a high-quality silicon carbide layer for use in thin film tensile stress resonators seems nontrivial. Other materials showing high bulk quality factors above $10^5$ include diamond, where cantilevers have been reported to preserve their high quality factors down the nm scale, as well as calcium fluoride, although the latter has not been explored much yet. While the membrane is preferably a silicon nitride or silicon carbide membrane, the other materials mentioned above are also candidates.

As already mentioned, a major application of the mechanical oscillator devices provided by the invention is in MEMS sensors, in particular high-sensitivity sensors, e.g. for pressure and acceleration sensing. A preferred implementation is to optically read out the membrane oscillations and convert the optical signal to an electric signal for further processing. Other approaches to read out the oscillation frequency is pattern electrodes on the membranes and exploit electrodynamic transduction, electrostatic transduction, piezoresistive readout, and piezoelectric transduction.

Figure 15:
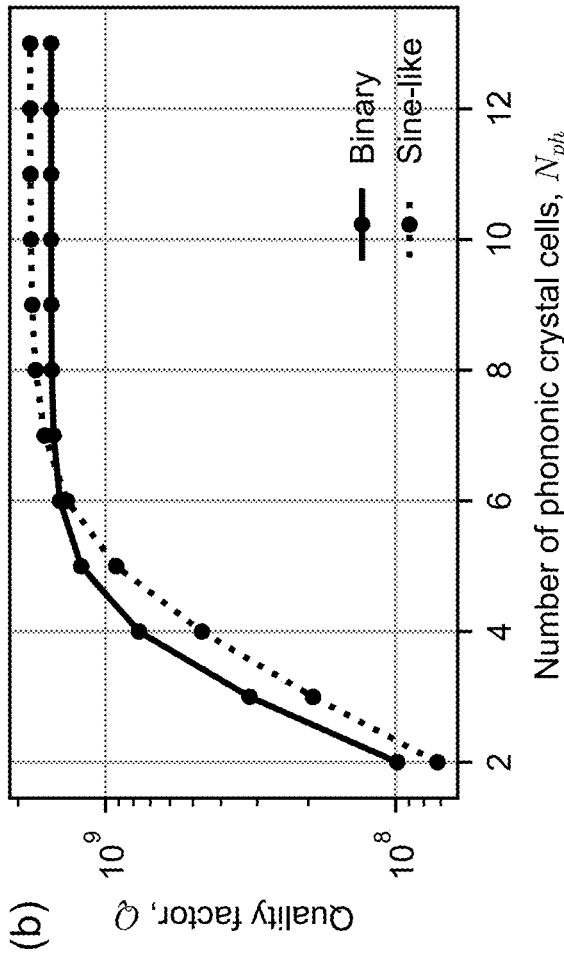
FIG. 15 is results from a study according to the disclosure to illustrate the effect of the number of phononic crystal cells $N_{ph}$ has on the intrinsic quality factor. 15(a) An example model for the of PnC pattern DP1 with $N_{ph}$=4. 15(b) The estimated quality factors. Assumes h=20 nm, θ=1.1 Gpa and $\beta_{surf}$=2.93×1011 $m^{-1}$. Both designs operate at 1.4 MHz.
Figure 15:
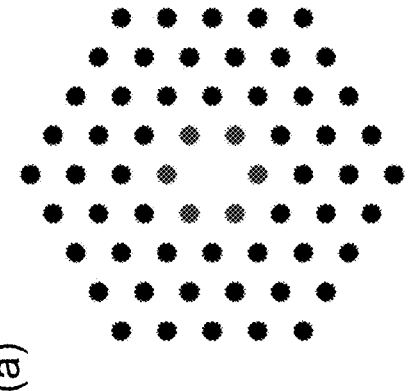

The number of phononic crystal cells, $N_{ph}$, determines how well the acoustic mode is confined to the defect. As will be discussed later in relation to FIG. 15, this number depends on the damping mechanism and the larger $N_{ph}$ the better confinement. The number of and periodicity of the phononic crystal cells, $N_{ph}$ and $a_{ph}$, sets a minimum size of the membrane, i.e. the area of the unsupported thin film. The 1 MHz oscillators were fabricated with the dimensions 4 mm×4 mm in size. Larger membranes enable oscillators with lower frequencies as well as a larger frequency-quality factor product. Smaller membranes lead to higher frequencies and are typically easier to fabricate.

The mechanical oscillator device may be scaled to different sizes and resonance frequencies using the design procedures and parameters provided in the present disclosure.

In one example, the mechanical oscillator device has a resonance frequency in the MHz range (1-10 MHz) and/or a phononic crystal cell periodicity, $a_{ph}$, in the range 0.1-100 μm. The fabricated devices reported herein lies in this range.

In another example, the mechanical oscillator device has a resonance frequency in the 10 MHz range (10-100 MHz) or a phononic crystal cell periodicity $a_{ph}$, in the range 0.01-10 μm. Such higher resonance frequency may be advantageous for certain sensing applications, high-speed sensing, quantum state transduction and quantum memory applications. Furthermore, a 10 MHz device could serve as a mechanical alternative to 10 MHz crystal oscillators as frequency references. Since fabrication techniques and material constraints will set a lower limit on pillar dimension and periodicity, the achievable Q-factor may be lower than for devices in the MHz range.

In yet another example, the mechanical oscillator device has a resonance frequency in the 100 kHz range (100-1.000 kHz) and/or a phononic crystal cell periodicity $a_{ph}$, in the range 1-1000 μm. Such lower resonance frequencies may be advantageous for certain sensing applications, manipulation of quantum states, generation of exotic quantum states for quantum information applications. Such larger devices may require different materials and fabrication techniques than those discussed herein.

Figure 10:
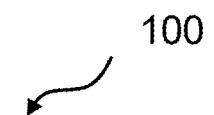
FIG. 10 is a flow chart illustration of a method for providing a mechanical oscillator according to the disclosure.

In still another example, the mechanical oscillator device has a resonance frequency in the 10 KHz range (10-100 kHz). Such lower resonance frequency may be advantageous for certain sensing applications, ultra-sensitive sensing, gravitational wave detection, The invention has been demonstrated experimentally in that several test batches were fabricated. FIG. 10 shows a flow diagram of an exemplary method 100 for providing a mechanical oscillator device. The method 100 comprises providing S102 a thin film (such as silicon nitride thin film, and/or silicon carbide thin film) on a supporting substrate (such as a silicon wafer, Si wafer, and/or silicon-based substrate).

In one or more example methods, providing S102 the thin film (such as silicon nitride, and/or silicon carbide) on the supporting substrate comprises depositing (S102A) the thin film on the supporting substrate by using chemical vapor deposition (CVD) technique such as low-pressure chemical vapor deposition (LPCVD), and/or plasma enhanced chemical vapor deposition (PECVD).

In one or more example methods, the thin film may comprise silicon nitride. The thin film may comprise silicon carbide. The thin film may comprise silicon. The thin film may comprise silicon dioxide. The thin film may comprise diamond. The thin film may comprise chalcogenide-based material. The thin film may comprise calcium fluoride. The thin film may comprise graphene. The thin film may be a crystalline material (such as quartz).

In one or more example methods, the supporting substrate may comprise silicon nitride. The supporting substrate may comprise silicon carbide. The supporting substrate may comprise silicon. The supporting substrate may comprise diamond. The supporting substrate may comprise silicon dioxide. The supporting substrate may comprise chalcogenide-based material. The supporting substrate may comprise calcium fluoride. The supporting substrate may comprise graphene. The supporting substrate may be a crystalline material (such as quartz).

In one or more example methods, providing S102 comprises depositing a second thin film on the surface of the thin film which is not in contact with the supporting substrate. In one or more example methods, the second thin film may be deposited on the surface of the supporting substrate, between the supporting substrate and the first thin film layer. In one or more example methods, the second thin film may act as a sacrificial layer. The second thin film may act as an intermediate layer. The second thin film may act as a protective layer.

In one or more example methods, the deposition of thin film on the substrate can be performed by using physical vapor deposition techniques (such as e-beam sputtering, magnetron sputtering).

In one or more example methods, the deposition of the thin film on the supporting substrate can be performed by using atomic layer deposition techniques.

In one or more example methods, the thin film may comprise an amorphous material. The thin film may comprise a crystalline material. The thin film may comprise an alloy. The thin film may have a thickness in the range of 5 nm to 20 nm. The thin film may have a thickness in the range of 20 nm to 50 nm. The thin film may have a thickness in the range of 50 nm to 100 nm.

In one or more example methods, the supporting substrate may comprise an amorphous material. The supporting substrate may comprise a crystalline material. The supporting substrate may comprise an alloy.

The method 100 comprises, providing S104 a multitude of discrete mass elements on a first section of the thin film, the mass elements being distributed to form regions of additional mass on the first section of the thin film, with each region of additional mass comprising a plurality of mass elements.

In one or more example methods, the first section of the thin film may indicate a surface of the thin film that is not in contact with the substrate.

In one or more example methods, providing S104 the multitude of discrete mass elements comprises patterning the multitude of discrete mass elements on the thin film by using lithography techniques (such as optical lithography, electron lithography, x-ray lithography, and/or ion lithography) combined with material etching technique (such as wet etching techniques, and/or dry etching techniques such as reactive ion etching (RIE)), to form regions of additional mass on the first section of the thin film.

In one or more example methods, a mass element may be an amorphous material. The mass element may be a crystalline material. The mass element may be an alloy. The mass element may be a combination of amorphous and crystalline material.

In one or more example methods, the mass element may be a nanostructure. The mass element may be a pillar, a sphere, a pyramid, a cube, a cuboid, a nanotube, and/or a nanoparticle. The mass element may have dimensions in the range of 5 nm to 50 nm. The mass element may have dimensions in the range of 50 nm to 100 nm. The mass element may have dimensions in the range of 100 nm to 150 nm. The mass element may have dimensions in the range of 150 nm to 200 nm. The mass element may have dimensions in the range of 200 nm to 500 nm.

In one or more example methods, the mass element may be a microstructure. The mass element may be a pillar, a sphere, a pyramid, a cube, a cuboid, a microtube, and/or a microparticle. The mass element may have dimensions in the range of 0.5 $\mu$m to 2 $\mu$m. The mass element may have dimensions in the range of 2 $\mu$m to 10 $\mu$m. The mass element may have dimensions in the range of 10 $\mu$m to 50 $\mu$m. The mass element may have dimensions in the range of 50 $\mu$m to 100 $\mu$m. The mass element may have dimensions in the range of 100 $\mu$m to 500 $\mu$m.

In one or more example methods, the regions of additional mass may form a periodic pattern (such as a hexagonal pattern) providing a phononic crystal structure on the first section of the thin film.

In one or more example methods, a region of additional mass may have a cylindrical shape. The region of additional mass may have a cube shape. The region of additional mass may have a cuboid shape. The region of additional mass may have a hemisphere shape.

In one or more example methods, the phononic crystal structure exhibits a defect for confining a mechanical oscillation mode of the membrane having a resonance frequency, f. In other words, the periodic pattern of additional mass regions may have a missing additional mass region.

In one or more example methods, providing a multitude of discrete mass elements on a first section of the thin film comprises introducing a defect by removing one or more discrete mass elements.

In one or more example methods, the defect may be introduced by removing the additional mass regions on the thin film. In one or more example methods, the defect may take a circular shape, a square shape, a hexagon shape, a rectangle shape, a rhombus shape, a triangle shape, a pentagon shape, and/or a polygon shape.

In one or more example methods, the defect (such as the missing additional mass region) may be introduced during the fabrication process. In one or more example methods, the defect may be introduced after the fabrication process. The defect may be introduced by using lithography techniques (such as optical lithography, electron lithography, x-ray lithography, and/or ion lithography) combined with material etching technique (such as wet etching techniques, and/or dry etching techniques such as reactive ion etching (RIE))

In one or more example methods, the mass elements have a minimum lateral dimension of less than ⅕, such as less than ⅛ or less than 1/10 or less than 1/15 or less than 1/20 of the wavelength of the mechanical oscillation mode.

The method 100 comprises shaping S106 the substrate to expose the first section of the thin film to form an unsupported membrane. In one or more example methods, shaping S106 the substrate to expose the first section of the thin film comprises etching of the supporting substrate from a side opposite the side holding the thin film to form the unsupported membrane (illustrated by arrow 5 in FIG. 2) by using wet etching techniques (such as by using potassium hydroxide, KOH, etching), and/or dry etching techniques.

The best samples had Qf products of $8 \times 10^{14}$ Hz at 1.41 MHz corresponding to $Q=5.65 \times 10^8$, which is higher than presently reported anywhere else for thin film membranes and only beaten by strain engineered phononic strings.

Appendix A

Which type of effective material density model is suitable for phononic crystals? If one assumes a membrane with no holes or features etched into it, the stress will be completely uniform. Far away from any boundaries the physics will then be completely described by a simple isotropic wave equation of the form $$T' \nabla^2 u(x, y) + m'' \frac{\partial^2 u}{\partial t^2} = p_e$$

which from a mathematically point of view is very similar to optical waves. It is then intuitive to generate direct mechanical analogues based on common photonic crystal designs. An often seen pattern with good bandgap properties is a binary distribution of circular shaped air domains placed on a hexagonal pattern in a dielectric material [1]. The circles represent high phase-velocity domains whereas the surrounding domain are slow phase-velocity. To limit the amount of mass getting added to the membrane an inverted adaptation of this distribution was studied as well as a softer sine-like distribution to demonstrate the flexibility of this scheme and compare the effects. These are shown in FIGS. 6A and 7A, respectively. The binary distribution is defined as $$g_{bin,0}(x, y) = \begin{cases} g_{max} - 1, & \sqrt{x^2 + y^2} \le \frac{\alpha_w}{2} a_{ph} \\ 0, & \text{otherwise} \end{cases}$$

$$g_{bin}(x, y) = 1 + g_{bin,0}(x, y) + g_{bin,0}\left(x - \frac{a_{ph}}{2}, y - \frac{\sqrt{3} a_{ph}}{2}\right) + $$

$$g_{bin,0}\left(x + \frac{a_{ph}}{2}, y - \frac{\sqrt{3} a_{ph}}{2}\right) + g_{bin,0}\left(x - \frac{a_{ph}}{2}, y + \frac{\sqrt{3} a_{ph}}{2}\right) + $$

$$g_{bin,0}\left(x + \frac{a_{ph}}{2}, y + \frac{\sqrt{3} a_{ph}}{2}\right)$$

-continued $$\text{for } -\frac{a_{ph}}{2} \le x \le \frac{a_{ph}}{2} \text{ and } -\frac{\sqrt{3} a_{ph}}{2} \le y \le \frac{\sqrt{3} a_{ph}}{2}$$

$$g_{bin}(x, y) = g_{bin}\left(x - n a_{ph}, y - m\sqrt{3} a_{ph}\right), \{n, m\} = 0, \pm 1, \pm 2, \ldots$$

and similarly for the sine-like distribution $$g_{sine,0}(x, y) = \begin{cases} \frac{g_{max} - 1}{2}\left[1 + \cos\left(2\pi \frac{\sqrt{x^2 + y^2}}{\alpha_w a_{ph}}\right)\right], & \sqrt{x^2 + y^2} \le \frac{\alpha_w}{2} a_{ph} \\ 0, & \text{otherwise} \end{cases}$$

with $g_{sine}(x, y)$ defined in the same manner as $g_{bin}(x, y)$. The effective density is then given by $\rho_{eff}(x,y) = \rho \cdot g p_i(x, y)$ where i={bin,sine}.

Both of these distributions have a few degrees of freedom. When ignoring the pillars these are: The maximum relative effective density $g_{max}$, relative distribution width $\alpha_w$ and the phononic crystal periodicity $\alpha_{ph}$. These will be explored in the next section.

Optimizing the density phononic crystal

How one eventually chooses to design the density phononic crystal has a huge effect on how well any modes confined to a defect will end up performing. A wide bandgap ensures an efficient isolation of the mode. However, the distribution may also be designed to prevent additional design-induced losses. Finally, while a large effective density contrast will generate a correspondingly wide bandgap, it is also increasingly difficult to fabricate, thus the lowest possible contrast may be used. All these factors were studied for the two proposed distributions presented in the previous section.

Figure 11:
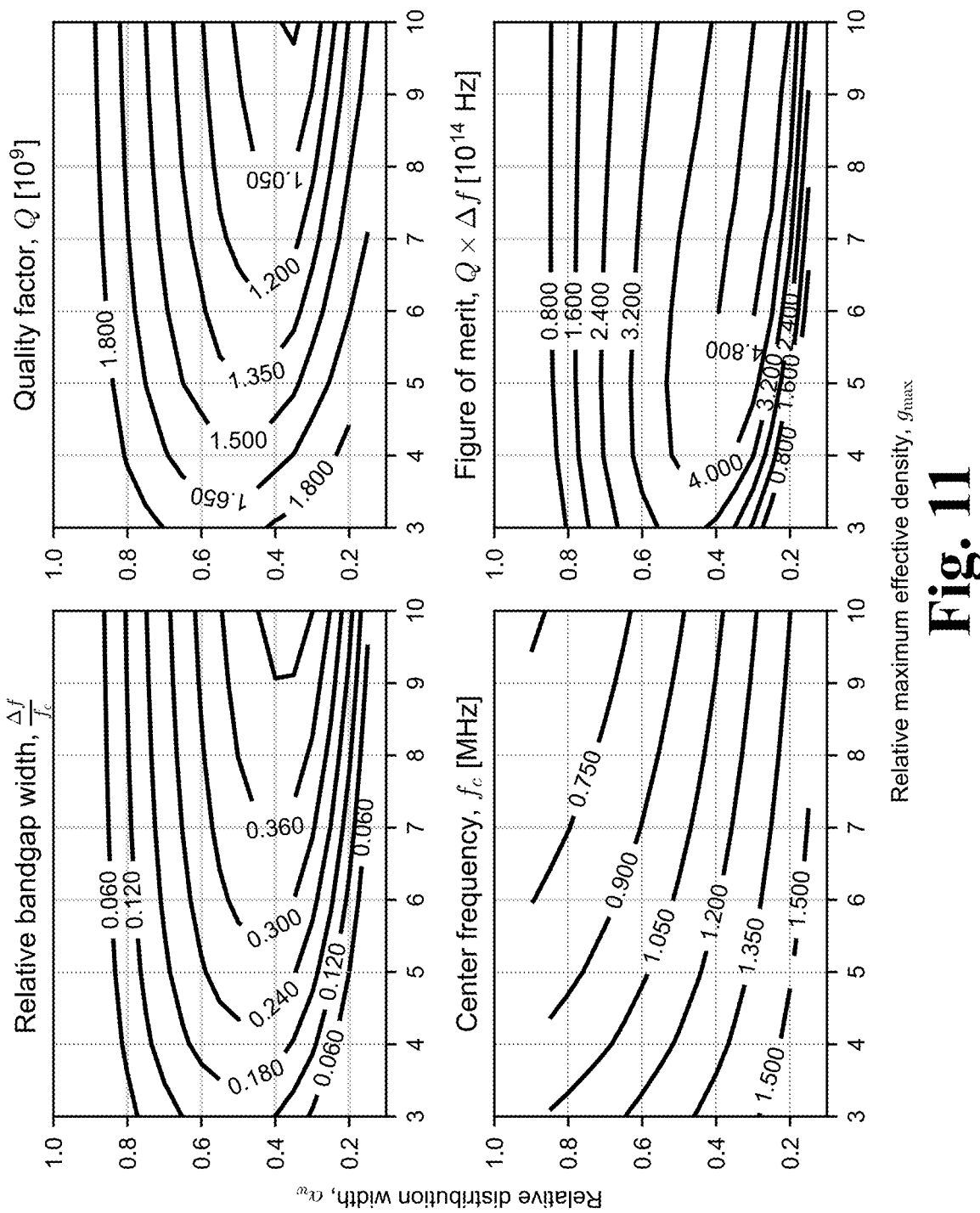
FIG. 11 are graphs from a study of a binary effective material density model based phononic crystal according to the disclosure. White areas have no bandgap defined. Quality factor estimated by taking the mean of the estimated quality factors of the mode just above and just below the bandgap. Simulated for h=20 nm, σ=1.1 GPa, $\beta_{surf}$=2.93× 1011 and $a_{ph}$=253 μm.

On FIG. 11 a range of parametric sweeps were conducted for the binary effective material density model. The phononic periodicity $\alpha_{ph}$ was kept constant as this simply scales the whole solution with respect to frequency. The remaining parameters are the relative distribution width $\alpha_w$ and relative effective density maximum $g_{max}$, which were swept across a meaningful range. For the bandgap width it is clear as the density contrast is increased the bandgap becomes wider just as one would expect. There is also clearly an optimum distribution width defined at $\alpha_w \approx 0.4$. However, at the same time the quality factor of a mode passing through a region of increasingly higher densities is reduced. This is a direct consequence of the phase velocity definition. Higher densities lead to slower velocities and therefore shorter wavelength. This in turn leads to sharper bending of the mode-shape and therefore higher losses. This compromise between bandgap and losses is also seen for stress phononic devices [2]. Moreover, the center frequency of the bandgap is red-shifted as the mass of the phononic cell increases.

How does one then pick the optimal set of parameters for a given density phononic distribution? For ultra-coherent resonators the important figure of merit is the Q×f product where $f_c$ is the center frequency. Since a wide bandwidth is desirable, a proposed figure of merit for choosing the optimum bandgap design is $$Q \times f_c \times \frac{\Delta f}{f_c} = Q \times \Delta f.$$

This is also shown on FIG. 11, where a line of optimum solutions can be seen. In fact, based on this definition no improvement of the device can be seen for $g_{max} \ge 5$. Above this range, the added mass will reduce the quality factor and frequency at the same rate as the bandgap is enhanced. Going above $g_{max}=5$ is then a compromise between strong mode isolation versus high quality factor.

Figure 12:
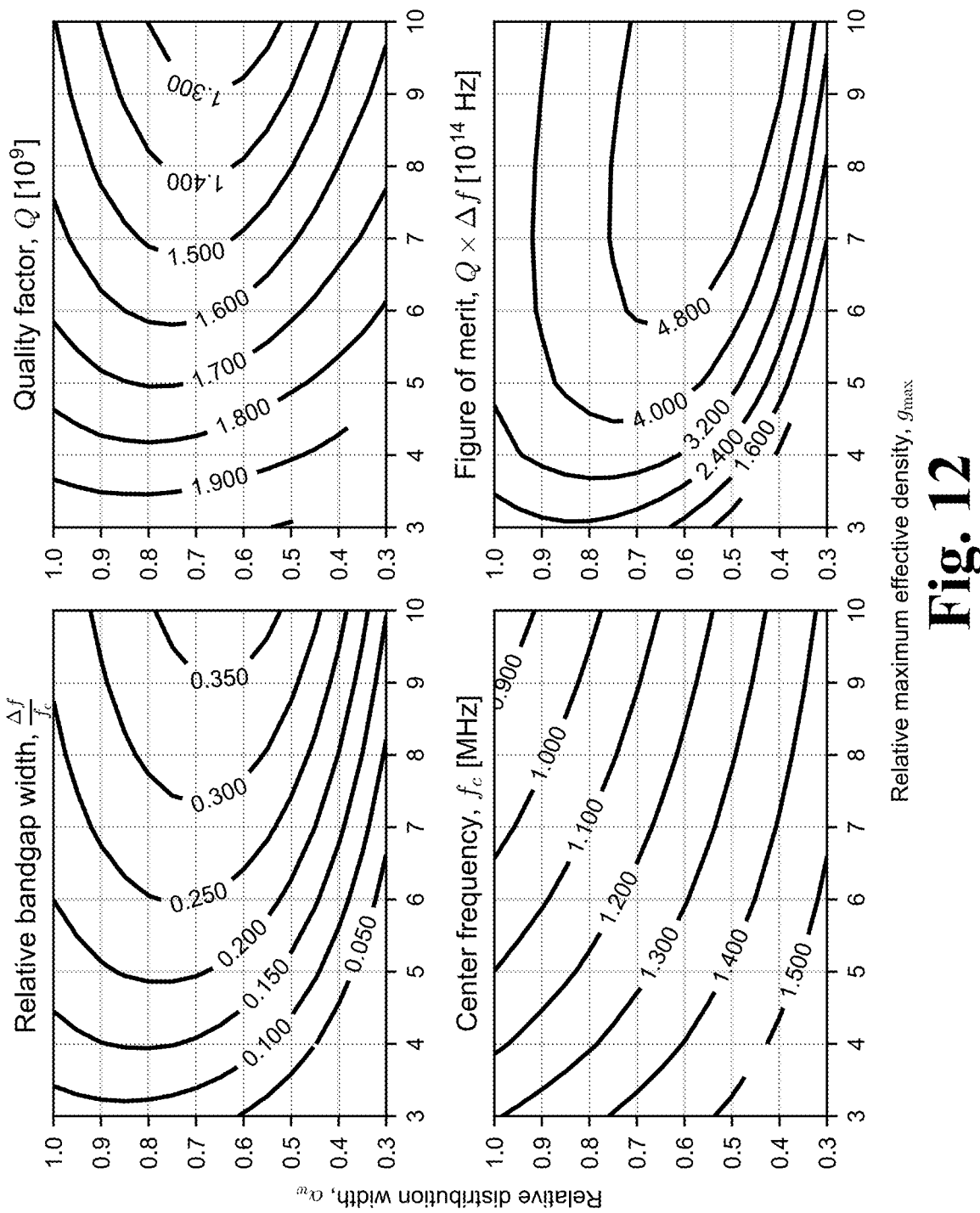
FIG. 12 are graphs from a study of a sine-like effective material density model based phononic crystal according to the disclosure. White areas have no bandgap defined. Quality factor estimated by taking the mean of the estimated quality factors of the mode just above and just below the bandgap. Simulated for h=20 nm, σ=1.1 GPa, $\beta_{surf}$=2.93× 1011 and $a_{ph}$=260 μm.

The same study was performed for the sine-like distribution and presented in FIG. 12. Overall, the same conclusions can be drawn. The only significant difference can be seen when comparing the $Q \times \Delta f$ products of the two distributions. They converge to about the same maximum value, but the sine-like distribution reaches this plateau for a broader range of parameters, and it is obtained for a slightly higher $g_{max}$ just below 6. In general, the sine-like distribution obtains slightly lower losses at the cost of slightly worse bandgap widths.

Phononic Membrane Designs

Next step in the design process is to use the knowledge obtained from the phononic crystal analysis to design full-scale membranes. This section presents the membrane designs developed and discusses how the defects can be engineered to properly confine a mode interest. Two main designs were developed:

DP1: Binary density model with $\alpha_w=0.4$, $\alpha_{ph}=198.8$ µm, $g_{max}=5$ and $g_{cmax}=3.9$.

DP2: Sine-like density model with $\alpha_w=0.4$, $\alpha_{ph}=198.8$ µm, $g_{max}=5$ and $g_{cmax}=3.9$.

The $g_{cmax}$ parameter will become apparent later. Both of the designs were engineered to have a defect-confined mode at exactly 1.4 MHz at the center of the bandgap. The PnC pattern designs and characteristics are shown on FIGS. 13 and 14 for design DP1 and DP2 (same pattern, different density distriction in cells), respectively.

Figure 13:
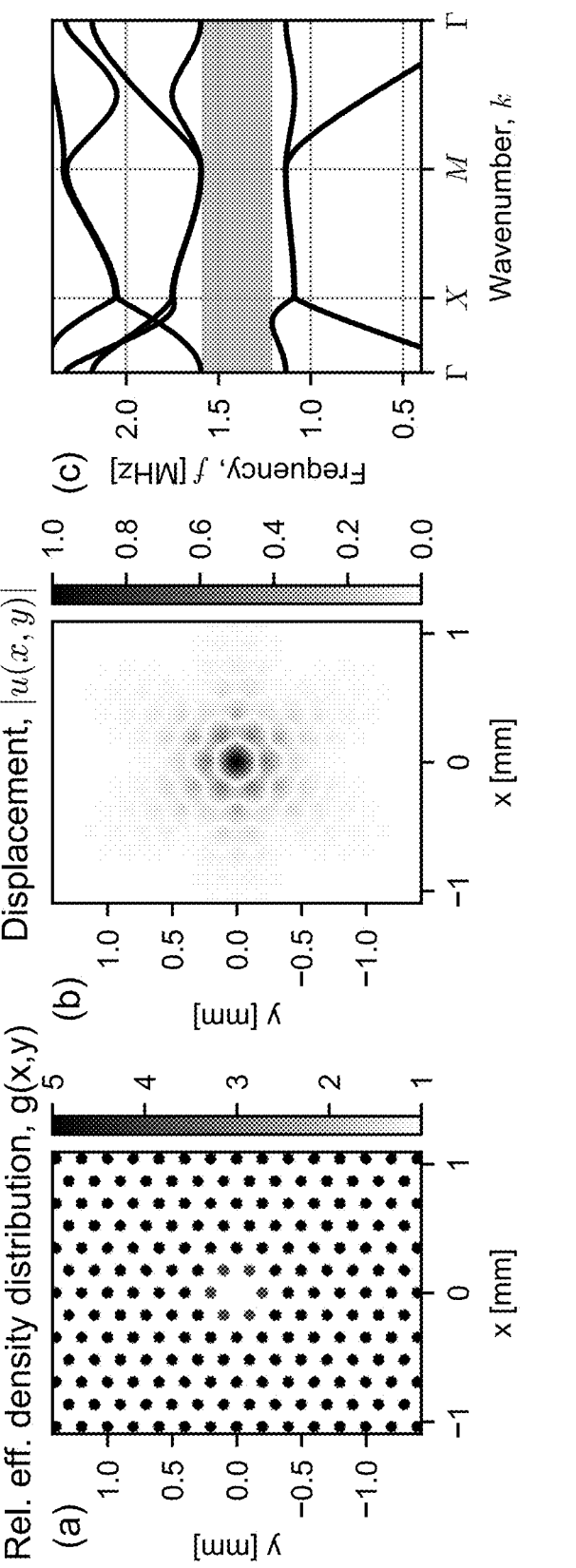
FIG. 13 illustrates results from a study of density phononic membrane design DP1 according to the disclosure, with 13(a): Relative effective density model of the PnC pattern near the defect of an infinite membrane. 13(b) Mode-shape of the defect confined mode at 1.4 MHz. 13(c): Dispersion relation of the chosen phononic crystal design. The band-gap is marked by a shaded region and has a width of Δf=383 kHz.

The density model for DP1 in FIG. 13($a$) illustrates how the defect can be implemented. The enhanced density is removed at one of the cells. This disturbance in the lattice is enough to confine an eigen-mode to the defect. However, the resonance frequency of such a mode won't be well centered within the bandgap, but instead be near the lower end. In order to guarantee maximum mode confinement, the resonance frequency may be shifted to the center of the bandgap. This is easily achieved by manipulating the phononic cells right next to the defect. By lowering their effective density to $g_{cmax}$ the effective mass of the defect confined mode is reduced which results in a higher resonance frequency.

Simulations of the defect confined mode is shown FIG. 13($b$) confirming the mode-confining behavior. The bandgap for this specific configuration was estimated and shown in FIG. 13($c$). An interesting difference between this and what is typically seen for stress phononic bandgaps is the absence of fast-traveling in-plane modes within the bandgap. Stress phononic membranes only exhibit a so-called pseudo bandgap whereas the density phononic membranes exhibit a full bandgap. No deeper study was performed into this. It is known the in-plane modes' stiffness are unaffected by in-plane tensile stress and therefore stress-modulating a membrane or string cannot ever create a bandgap for all types of vibrations simultaneously [3]. Conversely, mass contrast works equally well on all types of vibrations and is likely the reason for the full bandgap.

Figure 14:
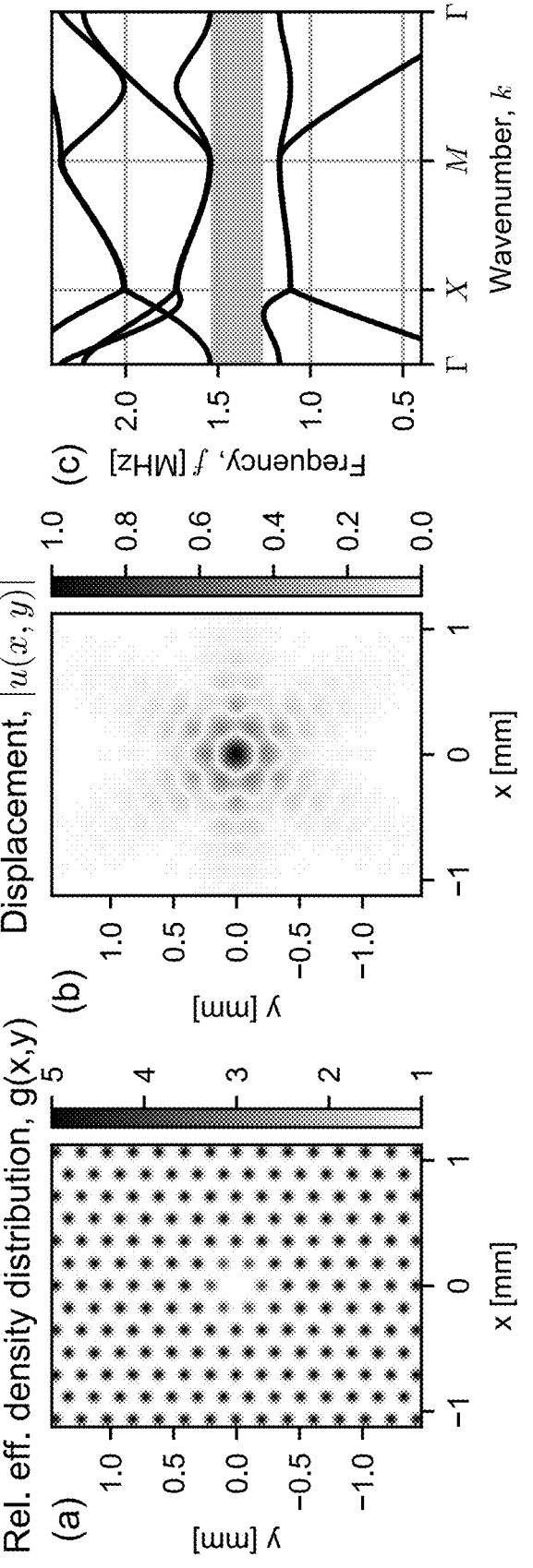
FIG. 14 illustrates results from a study of density phononic membrane design DP2 according to the disclosure, with 14(a): Relative effective density model of the PnC pattern near the defect of an infinite membrane. 14(b) Mode-shape of the defect confined mode at 1.4 MHz. 14(c) Dispersion relation of the chosen phononic crystal design. The band-gap is marked by a shaded region and has a width of Δf=286 kHz.

The mass element density distribution for DP2 at FIG. 14($a$) was designed and manipulated in the exact same manner as DP1. The dispersion diagram in FIG. 14($b$) shows a somewhat narrower width of the bandgap. By comparing the defect-confined mode-shape in FIG. 14C($c$) with DP1 one can (with a sharp eye) barely see the mode is slightly less confined for DP2 as a result.

A further design parameter is how many phononic crystal cells (i.e. number of repetitions of the pattern) are needed for proper mode confinement, $N_{ph}$. This number depends on the damping mechanism. For intrinsic losses one needs to keep adding more crystals until the boundary bending losses become insignificantly small. For phonon tunneling losses one needs to reduce the coupling to the substrate until only the intrinsic losses dominate. The risk of resonant coupling to a substrate mode might lead to a large mode isolation requirement, but this has so far not been investigated. One may choose to be on the safe side and simply fabricate huge membranes with many cells. However, huge membranes, especially thin highly stressed membranes, are increasingly difficult to fabricate as the size goes up. A study was performed to numerically estimate the required number of cells. For simplicity, only the intrinsic losses were considered. Moreover, a hexagonal window was assumed as this fits naturally with the lattice as shown on FIG. 15($a$). The results for both resonators are presented on FIG. 15($b$) using the extracted surface loss parameter from the topology optimized trampolines.

From the simulations it is clear how even the small difference in bandgap width affects the required number of phononic crystal cells. For DP1 the minimum number of cells needed is approximately $N_{ph}=7$ and for DP2 it is around $N_{ph}=9$. This small difference can lead to a significant difference in yield during fabrication, since this directly correlates to larger membranes, which are more difficult to fabricate. However, above this limit DP2 is predicted to have a slightly higher quality factor, which is expected based on the prior phononic crystal analysis.

References

[1] J. D. Joannopoulos, R. D. Meade, and J. N. Winn, *PhotonicCrystals: Molding the Flow of Light*, Second Edi, Vol. 3 (Princeton University Press, Singapore, 1995).

[2] C. Reetz, R. Fischer, G. G. T. Assumpção, D. P. McNally, P. S. Burns, J. C. Sankey, and C. A. Regal, *Analysis of Membrane Phononic Crystals with Wide Band Gaps and Low-Mass Defects*, Phys. Rev. Appl. 12, 1 (2019).

[3] S. A. Fedorov, N. J. Engelsen, A. H. Ghadimi, M. J. Bereyhi, R. Schilling, D. J. Wilson, and T. J. Kippenberg, *Generalized Dissipation Dilution in Strained Mechanical Resonators*, Phys. Rev. B 99, 1 (2019).

The invention claimed is:

1. A mechanical oscillator device comprising:
a thin film on a supporting substrate, wherein the supporting substrate is shaped to expose an area of the thin film to form an unsupported membrane; wherein the membrane comprises periodic pattern of regions of additional mass, wherein:
the periodic pattern of the regions of additional mass provides a phononic crystal structure on the membrane wherein each region of additional mass is a unit cell in the phononic crystal structure and
the phononic crystal structure exhibits a defect for confining a mechanical oscillation mode having a resonance frequency, f, and corresponding wavelength λ and
wherein the unit cell is formed by a distribution of discrete mass elements; and a minimum lateral dimension, d, of the mass elements is less than 1/10 of the wavelength of the mechanical oscillation mode.

2. The mechanical oscillator device according to claim 1, wherein the defect and/or the regions of additional mass adjacent to the defect are configured for the resonance frequency of the mechanical oscillation mode to fall within a frequency range of a bandgap of the phononic crystal structure.

3. The mechanical oscillator device according to claim 1, wherein the mass elements are pillars.

4. The mechanical oscillator device according to claim 1, wherein the mass elements have lateral dimension, d, and a mean distance, a, and 0,2a<d<0,8a.

5. The mechanical oscillator device according to claim 1, wherein the mass elements have a mean distance, a, with a<5 micron.

6. The mechanical oscillator device according to claim 1, wherein a majority of the mass elements are distributed periodically within regions of additional mass.

7. The mechanical oscillator device according to claim 6, wherein the periodical distribution is a hexagonal pattern.

8. The mechanical oscillator device according to claim 1, wherein a majority of the regions of additional mass are formed by at least substantially uniform distributions of at least substantially identical mass elements.

9. The mechanical oscillator device according to claim 1, wherein a majority of the regions of additional mass is formed by at least substantially identical mass elements whose distribution have a density that decreases towards a boundary of the regions of additional mass.

10. The mechanical oscillator device according to claim 1, wherein a majority of the regions of additional mass is formed by an at least substantially uniform distribution of mass elements whose dimensions decreases towards a boundary of the regions of additional mass.

11. The mechanical oscillator device according to claim 1, wherein the membrane is a silicon nitride or silicon carbide membrane.

12. The mechanical oscillator device according to claim 1, wherein a uniform tensile stress along at least one direction in the plane of the membrane is provided.

13. The mechanical oscillator device according to claim 1, wherein the minimum lateral dimension, d, of the mass elements is less than $\frac{1}{20}$ of the wavelength of the mechanical oscillation mode.

14. A sensor comprising the mechanical oscillator device according to claim 1, wherein the sensor is configured to detect an oscillation characteristic of the membrane.

15. A method for providing a mechanical oscillator device, comprising:

providing a thin film on a supporting substrate;

providing on a first section of the thin film, a periodic pattern of regions of additional mass wherein the periodic pattern of the regions of additional mass provides a phononic crystal structure on the first section of the thin film wherein each region of additional mass is a unit cell in the phononic crystal structure; and shaping the supporting substrate to expose the first section of the thin film to form an unsupported membrane;

wherein the phononic crystal structure exhibits a defect for confining a mechanical oscillation mode of the membrane having a resonance frequency, f, and corresponding wavelength, $\lambda$, and wherein each region of additional mass is formed by a distribution of discrete mass elements and a minimum lateral dimension, d, of the mass elements is less than $\frac{1}{10}$ of the wavelength of the mechanical oscillation mode.

16. The method according to claim 15, wherein:

providing the thin film on the supporting substrate comprises depositing the thin film on the substrate by a chemical vapor deposition technique;

providing a multitude of discrete mass elements on a first section of the thin film comprises patterning the multitude of discrete mass elements on the thin film by a reactive ion etching technique;

providing a multitude of discrete mass elements on a first section of the thin film comprises introducing a defect by removing one or more discrete mass elements; and shaping the supporting substrate to expose the first section of the thin film to form an unsupported membrane comprises etching of the supporting substrate with potassium hydroxide, from a side opposite a side holding the thin film to form the unsupported membrane.

\*  \*  \*  \*  \*